(12) United States Patent
Park

(10) Patent No.: US 11,429,282 B2
(45) Date of Patent: Aug. 30, 2022

(54) APPARATUS AND METHOD FOR IMPROVING INPUT/OUTPUT THROUGHPUT OF MEMORY SYSTEM

(71) Applicant: SK hynix Inc., Gyeonggi-do (KR)

(72) Inventor: Jeen Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/920,062

(22) Filed: Jul. 2, 2020

(65) Prior Publication Data

US 2021/0200443 A1  Jul. 1, 2021

(30) Foreign Application Priority Data

Dec. 27, 2019 (KR) .................... 10-2019-0176645

(51) Int. Cl.
*G06F 3/06* (2006.01)
(52) U.S. Cl.
CPC .......... *G06F 3/0613* (2013.01); *G06F 3/0656* (2013.01); *G06F 3/0658* (2013.01); *G06F 3/0659* (2013.01); *G06F 3/0683* (2013.01)
(58) Field of Classification Search
CPC .... G06F 3/0659; G06F 3/0613; G06F 3/0688; G06F 3/0656; G06F 3/0658; G06F 3/0683
See application file for complete search history.

(56) References Cited

U.S. PATENT DOCUMENTS

| | | | |
|---|---|---|---|
| 8,239,589 B1 | 8/2012 | Certain et al. | |
| 8,918,595 B2 * | 12/2014 | Ebsen | G06F 13/1673 711/151 |
| 9,229,854 B1 | 1/2016 | Kuzmin et al. | |
| 9,432,298 B1 | 8/2016 | Smith | |
| 2015/0019798 A1 | 1/2015 | Huang | |
| 2016/0179402 A1 * | 6/2016 | Iwashiro | G06F 3/0688 711/103 |

* cited by examiner

*Primary Examiner* — Ernest Unelus
(74) *Attorney, Agent, or Firm* — IP & T Group LLP

(57) ABSTRACT

A memory system may include a plurality of memory dies configured to store data therein, and a controller coupled to the plurality of memory dies through a plurality of channels, and configured to correlate at least some of a plurality of read requests and transferring the plurality of read requests to the plurality of channels, such that the plurality of read requests are processed in an interleaving way through the plurality of channels, when controlling the plurality of memory dies for the plurality of read requests. The controller may determine whether to perform the correlation operation in response to the number of the plurality of read requests, wherein the plurality of read requests include a read request for an internal operation of the controller and a read request received from a host.

27 Claims, 16 Drawing Sheets

FIG. 9

| Input order | RD_REQ | LBA |
|---|---|---|
| 1 | EX_RD_REQ1 | LA001 |
| 2 | EX_RD_REQ2 | LB102 |
| 3 | EX_RD_REQ3 | LB202 |
| 4 | IN_RD_REQ4 | LB17 |
| 5 | EX_RD_REQ5 | LB405 |
| 6 | EX_RD_REQ6 | LB506 |
| 7 | EX_RD_REQ7 | LB607 |
| 8 | EX_RD_REQ8 | LB708 |
| 9 | IN_RD_REQ9 | LB111 |
| 10 | IN_RD_REQ10 | LB91 |

⇩

1st operation

| Input order | RD_REQ | LBA | CH |
|---|---|---|---|
| 1 | EX_RD_REQ1 | LA001 | CH1 |
| 2 | EX_RD_REQ2 | LB102 | CH2 |
| 3 | EX_RD_REQ3 | LB202 | CH2 |
| 4 | IN_RD_REQ4 | LB17 | CH1 |
| 5 | EX_RD_REQ5 | LB405 | CH1 |
| 6 | EX_RD_REQ6 | LB506 | CH1 |
| 7 | EX_RD_REQ7 | LB607 | CH1 |
| 8 | EX_RD_REQ8 | LB708 | CH2 |
| 9 | IN_RD_REQ9 | LB111 | CH2 |
| 10 | IN_RD_REQ10 | LB91 | CH2 |

FIG. 10

| Input order | RD_REQ | LBA | | CH |
|---|---|---|---|---|
| 1 | EX_RD_REQ1 | LA001 | | CH1 |
| 2 | EX_RD_REQ2 | LB102 | | CH2 |
| 3 | EX_RD_REQ3 | LB202 | | CH2 |
| 4 | IN_RD_REQ4 | LB17 | | CH1 |
| 5 | EX_RD_REQ5 | LB405 | | CH1 |
| 6 | EX_RD_REQ6 | LB506 | | CH1 |
| 7 | EX_RD_REQ7 | LB607 | | CH2 |
| 8 | EX_RD_REQ8 | LB708 | | CH2 |
| 9 | IN_RD_REQ9 | LB111 | | CH2 |
| 10 | IN_RD_REQ10 | LB91 | | CH2 |

2nd operation

| | | |
|---|---|---|
| 1st correlated | EX_RD_REQ1 | CH1 |
| | EX_RD_REQ2 | CH2 |
| 2nd correlated | EX_RD_REQ3 | CH2 |
| | IN_RD_REQ4 | CH1 |
| 3rd correlated | EX_RD_REQ5 | CH1 |
| | EX_RD_REQ8 | CH2 |
| 4th correlated | EX_RD_REQ6 | CH1 |
| | IN_RD_REQ9 | CH2 |
| 5th correlated | EX_RD_REQ7 | CH1 |
| | IN_RD_REQ10 | CH2 |

APPARATUS AND METHOD FOR IMPROVING INPUT/OUTPUT THROUGHPUT OF MEMORY SYSTEM

CROSS-REFERENCE TO RELATED APPLICATION

This application claims priority under 35 U.S.C. § 119 to Korean Patent Application No. 10-2019-0176645 filed on Dec. 27, 2019, which is incorporated herein by reference in its entirety.

BACKGROUND

1. Field

Embodiments relate to a memory system, and more particularly, to an apparatus and method for improving throughput of a memory system through an interleaving operation on a plurality of memory dies.

2. Discussion of the Related Art

Recently, a computer environment paradigm has shifted to ubiquitous computing, which enables a computer system to be accessed virtually anytime and everywhere. As a result, the use of portable electronic devices such as mobile phones, digital cameras, notebook computers and the like increases. Such portable electronic devices typically use or include a memory system that uses or embeds at least one memory device, i.e., a data storage device. The data storage device can be used as a main storage device or an auxiliary storage device of a portable electronic device.

In a computing device, unlike a hard disk, a data storage device used as a nonvolatile semiconductor memory device is advantageous in that it has excellent stability and durability because it has no mechanical driving part (e.g., a mechanical arm), and has high data access speed and low power consumption. Examples of such a data storage device include a universal serial bus (USB) memory device, a memory card having various interfaces, and a solid state drive (SSD).

SUMMARY

Various embodiments are directed to a memory system capable of rapidly and stably processing data into a memory device by minimizing the complexity and degradation in throughput of the memory system, and maximizing the use efficiency of the memory device, and an operation method thereof.

Also, various embodiments are directed to an apparatus and method for improving input and output (I/O) throughput of a memory system by inputting and outputting data through an interleaving operation on a plurality of memory dies in the memory system.

Also, various embodiments are directed to an apparatus and method capable of improving the stability of operation and the lifetime of a memory system by more efficiently utilizing a plurality of dies, even though physical locations in which data are to be stored are not limited to an interleaving operation during a process of storing data in a plurality of memory dies in the memory system.

Also, various embodiments are directed to an apparatus and method which can dynamically determine whether to perform or skip a correlation operation in response to the configuration of a memory system and the characteristic of the correlation operation for data read and write operations performed in the memory system, thereby reducing an unnecessary overhead.

Also, various embodiments are directed to an apparatus and method capable of improving the utilization of channels by performing a read operation on an idle memory die within a memory system.

The effects of the apparatus and method in accordance with the present embodiments will be described as follows.

The memory system and the operation method thereof in accordance with the present embodiments can reduce an overhead for an interleaving operation within the memory system while removing or reducing address limitations on a physical location within the memory system for the interleaving operation.

Furthermore, the memory system and the operation method thereof can reduce address limitations on physical limitations within the memory system for an interleaving operation while improving I/O throughput of the memory system through the interleaving operation, thereby improving the efficiency and lifetime of the memory device.

In accordance with an embodiment, a memory system includes a plurality of memory dies configured to store data therein; and a controller coupled with the plurality of memory dies via a plurality of channels and configured to perform a correlation operation on at least some read requests among a plurality of read requests inputted from a host so that the plurality of memory dies output plural pieces of data corresponding to the plurality of read requests via the plurality of channels in an interleaving way, wherein the controller is configured to determine when to perform the correlation operation based on the number of the plurality of read requests, and wherein the plurality of read requests include a read request for an internal operation of the controller and a read request received from a host.

The controller may determine an idle channel among the plurality of channels and may perform the correlation operation on the plurality of read requests except for the read request for the internal operation, which is related to the idle channel, among the plurality of read requests.

The controller may transfer the read request for the internal operation which is related to the idle channel to the plurality of memory dies through the idle channel, and the correlation operation is not performed.

The controller may determine a transferring order of the read request for the internal operation related to the idle channel, based on a receiving order of the read request for the correlation operation.

The controller may set a transferring priority of the read request having the earliest receiving order as the highest priority.

The memory system may further comprise a plurality of channel buffers configured to temporarily store the plurality of read requests to be transferred to the plurality of channels, and corresponding to the respective channels.

The controller may determine a channel as an idle channel corresponding to a channel buffer which stores the plurality of read requests when a number of the plurality of requests is less than a target value, among the plurality of channel buffers.

The data corresponding to the plurality of read requests is outputted to the plurality of channels from the plurality of memory dies in response to the plurality of read requests.

The controller may output data, corresponding to a read request received from the host, to the host among the data corresponding to the plurality of read requests.

The memory system may further comprise an output buffer configured to temporarily store data to be outputted to the host.

The controller is configured to perform the correlation operation when the number of pieces of data stored in the output buffer, to be outputted to the host, is greater than a set value.

The output buffer may include a queue capable of outputting stored data according to an input sequence of the stored data, and the controller may determine the set value, based on a first data input/output speed between the host and the memory system and a second data input/output speed between the controller and the plurality of memory dies.

The controller is configured to perform the correlation operation when the number of the plurality of read requests transferred for the correlation operation is greater than the number of the plurality of channels.

The controller is configured to stop the correlation operation on remaining read requests not yet correlated when the number of remaining read requests is less than the number of the plurality of memory dies.

The controller may determine whether to perform or skip a correlation operation on the plurality of read requests, based on the number of the plurality of read requests transferred for the correlation operation, and transfer a correlated read request earlier than an uncorrelated read request among the plurality of read requests.

The controller may perform the correlation operation to correlate the plurality of read requests by the number of the plurality of channels.

In accordance with an embodiment, an operation method of a memory system includes determining when to perform a correlation operation based on the number of a plurality of read requests for the correlation operation; performing the correlation operation on the plurality of read requests, based on a determination result; transferring the correlated read requests to a plurality of channels coupled to a plurality of memory dies; and receiving data corresponding to the correlated read request from the plurality of memory dies via the plurality of channels in an interleaving way, wherein the plurality of read requests comprise a read request for an internal operation of the memory system and a read request received from a host.

The performing of the correlation operation on the plurality of read requests may include determining an idle channel among the plurality of channels; and performing the correlation operation on the plurality of read requests except for the read request for the internal operation, which is related to the idle channel, among the plurality of read requests.

The operation method may further comprise transferring the read request for the internal operation which is related to the idle channel to the plurality of memory dies through the idle channel and the correlation operation is not performed.

The transferring of the read request for the internal operation, may comprise determining a transferring order of the read request for the internal operation related to the idle channel, based on a receiving order of the read request for the correlation operation.

The determining of the transferring order may include setting a transferring priority of the read request having the earliest receiving order as the highest priority.

The determining of the idle channel may include temporarily storing read requests to be transferred to the plurality of channels, and checking the numbers of read requests stored in a plurality of channel buffers corresponding to the plurality of channels, respectively; and determining a channel as an idle channel corresponding to a channel buffer which stores the plurality of read requests when a number of the plurality of read request is less than a target value, among the plurality of channel buffers.

The operation method may further include outputting data, corresponding to a read request received from the host, to the host among the data corresponding to the plurality of read requests.

The determining when to perform a correlation operation may include performing the correlation operation when the number of pieces of data stored in an output buffer, to be outputted to the host, is greater than a set value, the set value is determined based on a first data input/output speed between the host and the memory system and a second data input/output speed between the controller and the plurality of memory dies.

The determining when to perform a correlation operation may include stopping the correlation operation on remaining read requests not yet correlated when the number of remaining read requests is less than the number of the plurality of memory dies.

The performing of the correlation operation may include determining whether to perform or skip a correlation operation on the plurality of read requests, based on the number of the plurality of read requests transferred for the correlation operation.

The performing of the correlation operation may include transferring a correlated read request earlier than an uncorrelated read request among the plurality of read requests.

The performing of the correlation operation may include performing the correlation operation to correlate the plurality of read requests by the number of the plurality of channels.

BRIEF DESCRIPTION OF THE DRAWINGS

FIG. 9 illustrates a first operation of a controller on a plurality of read requests in accordance with the first embodiment.

FIG. 10 illustrates a second operation of the controller on a plurality of read requests in accordance with the first embodiment.

DETAILED DESCRIPTION

Figure 1:
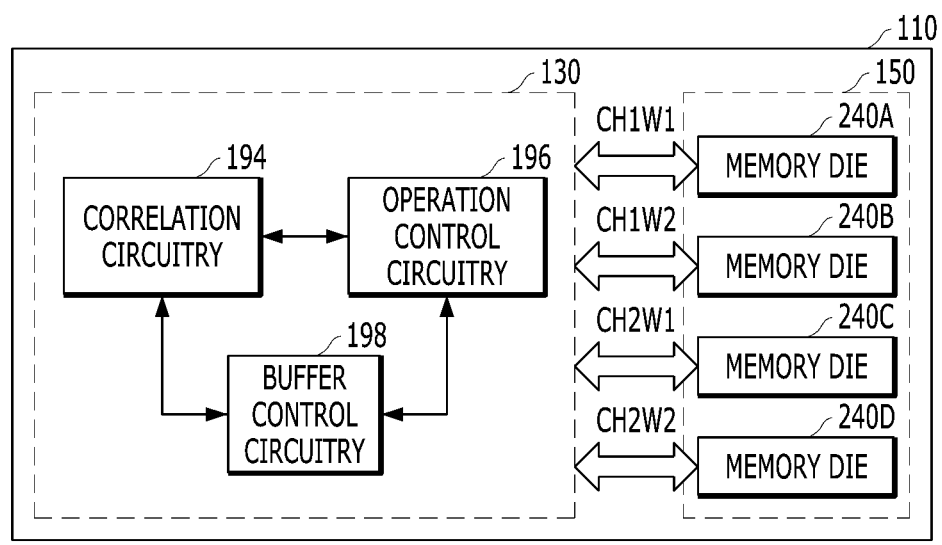
FIG. 1 illustrates a memory system according to an embodiment of the present invention.

Hereafter, various embodiments of the present invention will be described with reference to the accompanying drawings. It should be understood that the following descriptions will be focused on portions required for understanding an operation in accordance with various embodiments of the present invention, and descriptions of the other portions will be ruled out in order not to unnecessarily obscure subject matters of the present disclosure.

Hereafter, embodiments will be described in detail with reference to the accompanying drawings.

Hereinafter, various embodiments of the present invention are described below in detail with reference to the accompanying drawings. In the following description, it is to be noted that only parts necessary for understanding the operation according to the various embodiments will be described, and the description of the other parts will be omitted so as not to obscure the subject matter of the present disclosure.

Various examples of the disclosure are described below in more detail with reference to the accompanying drawings. Aspects and features of the present invention, however, may be embodied in different ways to form other embodiments, including variations of any of the disclosed embodiments. Thus, the invention is not to be construed as being limited to the embodiments set forth herein. Rather, the described embodiments are provided so that this disclosure is thorough and complete and fully conveys the disclosure to those skilled in the art to which this invention pertains. Throughout the disclosure, like reference numerals refer to like parts throughout the various figures and examples of the disclosure. It is noted that reference to "an embodiment," "another embodiment" or the like does not necessarily mean only one embodiment, and different references to any such phrase are not necessarily to the same embodiment(s).

It will be understood that, although the terms "first", "second", "third", and so on may be used herein to identify various elements, these elements are not limited by these terms. These terms are used to distinguish one element from another element that otherwise have the same or similar names. Thus, a first element in one instance could be termed a second or third element in another instance without departing from the spirit and scope of the invention.

The drawings are not necessarily to scale and, in some instances, proportions may have been exaggerated in order to clearly illustrate features of the embodiments. When an element is referred to as being connected or coupled to another element, it should be understood that the former can be directly connected or coupled to the latter, or electrically connected or coupled to the latter via one or more intervening elements therebetween. In addition, it will also be understood that when an element is referred to as being "between" two elements, it may be the only element between the two elements, or one or more intervening elements may also be present.

The terminology used herein is for the purpose of describing embodiments only and is not intended to be limiting of the invention. As used herein, singular forms are intended to include the plural forms and vice versa, unless the context clearly indicates otherwise. Similarly, the indefinite articles "a" and "an" mean one or more, unless it is clear from the language or context that only one is intended.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the invention belongs in view of the disclosure. It will be further understood that terms, such as those defined in commonly used dictionaries, should be interpreted as having a meaning that is consistent with their meaning in the context of the disclosure and the relevant art, and not be interpreted in an idealized or overly formal sense unless expressly so defined herein.

In the following description, numerous specific details are set forth in order to provide a thorough understanding of the invention. The invention may be practiced without some or all of these specific details. In other instances, well-known process structures and/or processes have not been described in detail in order not to unnecessarily obscure the invention.

It is also noted, that in some instances, as would be apparent to those skilled in the relevant art, a feature or element described in connection with one embodiment may be used singly or in combination with other features or elements of another embodiment, unless otherwise specifically indicated.

An embodiment of the disclosure may provide a memory system, a data processing system, and an operation process or a method, which may quickly and reliably process data into a memory device by reducing operational complexity and performance degradation of the memory system, thereby enhancing usage efficiency of the memory device.

In addition, an embodiment of the disclosure may provide a method and an apparatus for inputting and outputting plural pieces of data to and from a plurality of memory dies in a memory system via an interleaving way to improve data input/output performance (e.g., I/O throughput) of the memory system.

Further, an embodiment of the disclosure may provide a memory system which does not have a limitation to a physical location in which a piece of data is to be stored for an interleaving operation, in a process of storing the piece of data in a plurality of memory dies, thereby effectively utilizing the plurality of memory dies in the memory system so that operation stability and a lifespan of a memory system may be improved.

In addition, an embodiment of the disclosure may provide an apparatus and a method for dynamically determining whether to proceed or stop a correlation operation to plural requests based on a configuration of a memory system and/or characteristics of the correlation operation, which influences an operation such as reading or writing data performed in the memory system, so that overhead in operations performed in the memory system may be reduced.

In addition, an embodiment of the disclosure may provide a memory system including an address allocation scheme which reduces resources used for the correlation operation and supports an interleaving operation to a plurality of memory dies in the memory system, thereby increasing an operational efficiency of the memory system.

In an embodiment, a memory system may include a plurality of memory dies, and a controller coupled with the plurality of memory dies via a plurality of channels and configured to perform a correlation operation on at least some read requests among a plurality of read requests inputted from an external device so that the plurality of memory dies outputs plural pieces of data corresponding to the plurality of read requests via the plurality of channels in an interleaving way. The controller may be configured to determine when to perform the correlation operation based on the number of the plurality of read requests.

The controller may be configured to perform the correlation operation when the number of pieces of data, stored in an output buffer before being outputted to the external device, is greater than a threshold.

The output buffer may include a queue capable of outputting stored data according to an input sequence of the stored data. The controller may be configured to determine the threshold based on a first data input/output speed between the external device and the memory system, and a second data input/output speed between the controller and the plurality of memory dies.

The controller may be configured to skip the correlation operation when the number of the plurality of read requests is less than the number of the plurality of memory dies.

The controller may be configured to skip the correlation operation on the first read request to a (n−1)th read request among the plurality of read requests, and perform the correlation operation on an n-th read request to a last read request among the plurality of read requests. Herein, the 'n' may be the number of the plurality of channels.

The controller may be configured to halt or stop the correlation operation on remaining read requests not yet correlated when the number of the remaining read requests is less than the number of the plurality of memory dies.

The controller may be configured to allocate a physical location in the plurality of memory dies for programming each piece of data, regardless of a logical address related to the piece of data. The controller may be configured to perform the correlation operation based on map data.

The controller may be configured to allocate a physical location in the plurality of memory dies, based on the number of the plurality of dies and a logical address related to each piece of data. The controller may be configured to perform the correlation operation based on logical addresses corresponding to the plurality of read requests.

The memory system may further include a memory for storing map data, an input buffer for storing the plurality of read requests, and an output buffer for storing the plural pieces of data outputted to the external device.

The controller may include buffer control circuitry configured to monitor states of the input buffer and the output buffer to determine whether to perform the correlation operation, correlation circuitry configured to proceed, stop or skip the correlation operation on the plurality of read requests based on the number of the plurality of read requests received, and to transfer a correlated read request earlier than an uncorrelated read request among the plurality of read requests, and operation control circuitry configured to perform an address translation to the plurality of read requests according to a transferred sequence of the plurality of read requests, and to transfer the plurality of read requests to the plurality of memory dies via the plurality of channels.

The controller may be configured to store a correlation rate of the correlation operation, and to determine at least one threshold used as a reference for determining whether to proceed, stop or skip the correlation based on the correlation rate, the number of the plurality of channels and the number of the plurality of memory dies.

In another embodiment, a method for operating a memory system may include receiving a plurality of read requests inputted from an external device, determining when to perform a correlation operation on the plurality of read requests based on the number of the plurality of read requests received, performing the correlation operation on some read requests among the plurality of read requests based on a determination result, performing an address translation for a correlated read request to transfer the correlated read request to a plurality of memory dies via a plurality of channels, receiving data corresponding to the correlated read request from the plurality of memory dies via the plurality of channels in an interleaving way, and outputting the data to the external device.

The method may further include performing the address translation for an uncorrelated read request to transfer the uncorrelated read request to a plurality of memory dies via a plurality of channels, and receiving other data corresponding to the uncorrelated read request from the plurality of memory dies to output the other data to the external device.

The determining when to perform the correlation operation may include determining when the number of pieces of data, stored in an output buffer before outputted to the external device, is greater than a threshold. The threshold may be determined based on a first data input/output speed between the external device and the memory system and a second data input/output speed between the controller and the plurality of memory dies.

The performing the correlation operation may include skipping the correlation operation when the number of the plurality of read requests received is less than the number of the plurality of memory dies.

The performing the correlation operation may include skipping the correlation operation on the first read request to a (n−1)th read request among the plurality of read requests, and performing the correlation operation on n-th read request to the last read request among the plurality of read requests. Herein, the 'n' is the number of the plurality of channels.

The performing the correlation operation may further include halting or stopping the correlation operation on remaining read requests not yet correlated when the number of the remaining read requests is less than the number of the plurality of memory dies.

The method may further include allocating a physical location in the plurality of memory dies for programming each piece of data, regardless of a logical address related to the piece of data. The correlation operation may be performed based on map data.

The method may further include allocating a physical location in the plurality of memory dies, based on the number of the plurality of dies and a logical address related to each piece of data. The correlation operation may be performed based on logical addresses corresponding to the plurality of read requests.

The performing the correlation operation may include proceeding, stopping or skipping the correlation operation to the plurality of read requests based on the number of the plurality of read requests, transferring a correlated read request earlier than an uncorrelated read request among the plurality of read requests, and storing a correlation rate of the correlation operation to determine at least one threshold used as a reference for determining whether to proceed, stop or skip the correlation based on the correlation rate, the number of the plurality of channels, and the number of the plurality of memory dies.

In another embodiment, a memory system may include a plurality of memory dies, and a controller coupled with the plurality of memory dies via the plurality of channels. The controller may be configured to receive a plurality of read requests from a host, correlate at least one pair of read requests, which are selected from among the plurality of read requests. Two memory dies corresponding to the pair may be coupled to the controller via different channels. The controller may be further configured to transmit the pair of read requests to the corresponding two memory dies, and provide, to the host, data corresponding to the pair of read requests from the corresponding two memory dies. The correlating may be performed based on a correlating rate, the number of the plurality of channels, the number of the plurality of memory dies and the number of the plurality of read requests received.

Embodiments of the disclosure are described in detail below with reference to the accompanying drawings, wherein like numbers reference like elements.

FIG. 1 illustrates a memory system 110 according to an embodiment of the present invention. For example, in a computing device or a mobile device embedded with the memory system 110, a host (e.g., host 102 of FIG. 2) may be engaged with the memory system 110 for data input and output (I/O) operation. The host is a type of external device operatively engaged with the memory system 110.

Referring to FIG. 1, the memory system 110 may include a controller 130 and a memory device 150. The controller 130 may output data, which is requested by a host and delivered from the memory device 150, or store data inputted from the host 102 in the memory device 150. The memory device 150 may include a plurality of non-volatile memory cells, each capable of storing data. Here, an internal structure and/or configuration of the memory device 150 may vary depending on the applicable specification or desired performance of the memory device 150, which, in turn, may be based on the purpose(s) for which the memory system 110 is used or the requirement(s) of the host 102.

The controller 130 and the memory device 150 may be coupled through a plurality of data paths. For example, the memory device 150 may include a plurality of memory dies 240A, 240B, 240C, 240D, which may be coupled with the controller 130 through different data paths. The first memory die 240A and the controller 130 are coupled through a first channel (CH1) and a first way (W1) CH1W1, and the second memory die 240B and the controller 130 are coupled through the first channel (CH1) and a second way (W2) CH1W2. The first memory die 240A and the second memory die 240B may share the first channel CH1, but the first memory die 240A and the second memory die 240B may use different ways W1, W2 independently. In addition, the third memory die 240C and the controller 130 are coupled through the second channel (CH2) and the first way (W1) CH2W1, and the fourth memory die 240D and the controller 130 are coupled via the second channel (CH2) and the second way (W2) CH2W2. The number of channels and/or ways constituting the data paths between the controller 130 and the memory device 150 may vary depending on the number of memory dies in the memory device 150. The number of channels and ways coupling the memory dies 240A, 240B, 240C, 240D to the controller 130 may be different, according to the purpose(s) of the memory system 110 or requirement(s) of the host 102.

The plurality of memory dies 240A to 240D may be configured as different modules and independently coupled with the controller 130 via different data paths. When multiple data paths are used for data exchange, the plurality of memory dies 240A to 240D and the controller 130 may use an interleaving scheme via plural data paths for exchanging data to increase speed of data transfer in order to enhance the speed of data transfer between the memory device 150 and the controller 130.

For the interleaving scheme, data to be stored should be distributed over several modules rather than in a single module. In executing an interleaving scheme, a memory system may use an address limitation structure or an address scheme for distributing and storing plural pieces of new data over and in a plurality of modules of the memory device 150. For example, when programming four pieces of data, the conventional memory system stores four pieces of data in four memory dies individually. Here, the number of pieces of data may refer to the number of data units which may be stored together by a single program operation or a single write operation can be performed. For example, when a program operation (or a write operation) with a unit of page is performed, four pieces of data may include an amount of data programmed in four pages.

In order to increase operational efficiency of program and read operations and enhance distributed storage, a memory system may employ an address limitation structure. In the address limitation structure, when four pieces of data are programmed in four memory dies, the same physical location in each memory die is allocated. For example, when storing four pieces of data in the four memory dies, each of the four pieces of data is individually stored in the fifth physical location of a respective one of the four memory dies. Thereafter, when eight pieces of data are programmed, eight pieces of data may be stored in the sixth and seventh physical locations of each memory die. Here, the physical location may indicate a block or a page in a memory die.

When storing five pieces of data in four memory dies in a memory system with the address limitation structure, two pieces of data may be stored in first and second physical locations of the same memory die, and three pieces of data may be individually stored in a first physical location of the other three memory dies respectively. In the memory system with the address limitation structure, three pieces of dummy data are individually written in a second physical location of the remaining three memory dies because a piece of data inputted along with the next program request cannot be written subsequently in the second physical location of the other three memory dies.

When a memory system has an address limitation structure for an interleaving operation, an operational efficiency may be degraded because pieces of dummy data may need to be programmed whenever a program operation with odd pieces of data is performed. In addition, because each memory die does not always have the same operation state (in terms of health, wear, etc.), the memory system might have to independently perform an additional operation to compensate for each memory die condition, which may increase overhead.

The memory system 110 may adopt a full sync interleaving structure which is capable of supporting interleaving operations between the controller 130 and the memory device 150 without an address limitation structure. The full sync interleaving structure does not have an address limitation for storing data at the same location in each of a plurality of memory dies 240A to 240D in the memory device 150. The controller 130 may distribute pieces of data to be programmed according to an operation condition and an operation state of each memory die. In doing so, the pieces of data need not be evenly distributed to each memory die. For example, if one of the four memory dies 240A to 240D (e.g., the memory die 240A) cannot program a piece of data immediately due to an internal operation, the controller 130 may transfer plural pieces of data into three other memory dies (e.g., 240B, 240C, 240D). The controller 130 may distribute plural pieces of data over the plurality of memory dies 240A to 240D to increase efficiency of data transmission and reduce an operation margin of a program operation, but a strict rule such as the address limitation structure does not apply. In addition, in the memory system 110, it is unnecessary to program dummy data, unlike a memory system with the address limitation structure.

After the controller 130 transfers a piece of data into the memory device 150 and the piece of data is programmed in the memory device 150, the controller 130 may generate or update map information associating a logical address with a physical location (i.e., a physical address) corresponding to the data. In addition, the controller 130 may store updated map information in the memory device 150.

Because the memory system 110 does not adopt the address limitation structure as described above, it might be difficult to guarantee data transmission between the controller 130 and the memory device 150 in a process of reading and outputting plural pieces of data requested by a host (or an external device) performed in an interleaving way (i.e., by an interleaving scheme). Accordingly, the controller 130 may include correlation circuitry 194 for correlating a plurality of read operations requested by the host so that plural pieces of data outputted from the memory device 150 by the plurality of read operations may be transmitted in the interleaving way.

In FIG. 1, the controller 130 may include the correlation circuitry 194, operation control circuitry 196 and buffer control circuitry 198. As used in the disclosure, the term 'circuitry' can refer to any and all of the following: (a) hardware-only circuit implementations (such as implementations in only analog and/or digital circuitry) and (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions) and (c) to circuits, such as a microprocessor(s) or a portion of a microprocessor(s), that require software or firmware for operation, even if the software or firmware is not physically present. This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to a particular claim element, an integrated circuit for a storage device.

Figure 6:
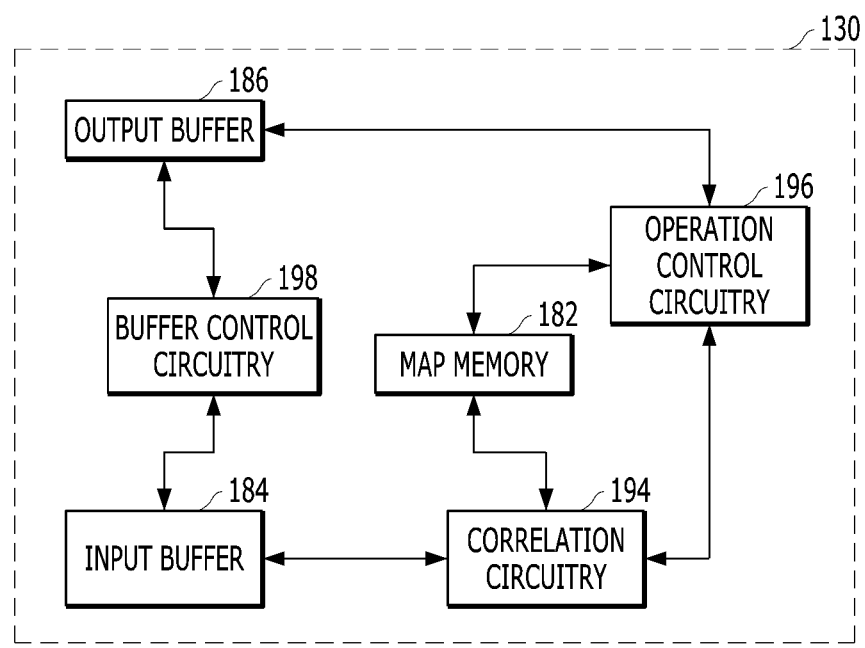
FIG. 6 illustrates a controller according to an embodiment of the present invention.

The buffer control circuitry 198 may control an input buffer and an output buffer (e.g., an input buffer 184 and an output buffer 186 of FIG. 6). The input buffer is configured to temporarily store a command or a piece of data which is inputted from the host. The output buffer is configured to temporarily store a piece of data corresponding to a command inputted from the host before the piece of data is transmitted to the host. For example, when the host sends read requests (or read commands) for reading plural pieces of data corresponding to 20 logical addresses to the memory system 110, the controller 130 receives the plural pieces of data corresponding to 20 logical addresses from the memory device 150, temporarily stores the plural pieces of data in the output buffer, and outputs the plural pieces of data to the host. The buffer control circuitry 198 may monitor or recognize how many pieces of data are temporarily stored in the output buffer before outputting to the host.

The operation control circuitry 196 may check a physical location in the memory device 150, which corresponds to a logical address, and read a piece of data stored in the physical location. In response to a read request (or a read command) along with a logical address from an input buffer, the operation control circuitry 196 may translate the logical address into a physical address based on the map information, and request a piece of data, stored in nonvolatile memory cells indicated by the physical address, to the memory device 150. The physical address may indicate a specific physical location in the plurality of memory dies 240A to 240D in the memory device 150. When the operation control circuitry 196 handles plural read requests according to an order or a sequence of the plural read requests delivered by the buffer control circuitry 198, physical addresses corresponding to the plural read requests may be randomly distributed over the plurality of memory dies 240A to 240D. For example, three consecutive physical addresses may indicate different locations in the same memory die, or four consecutive physical addresses may indicate different locations in different memory dies. In this situation, the data transmission between the controller 130 and the plurality of memory dies 240A to 240D may be sometimes performed in the interleaving way, but it is often to exchange data between the controller 130 and the plurality of memory dies 240A to 240D randomly, not in the interleaving way.

When the buffer control circuitry 198 determines that there are pieces of data to be outputted to the host in the output buffer, plural read requests (or plural read commands) and plural logical addresses from the host may be transmitted to the correlation circuitry 194. The correlation circuitry 194 may check map information regarding the plural logical addresses corresponding to the plural read requests from the buffer control circuitry 198 to correlate the plural read requests, so that the operation control circuitry 196 may perform plural read operations corresponding to the plural read requests in the interleaving way, i.e., according to the interleaving scheme, e.g., plural pieces of data are transferred in the interleaving way between the controller 130 and the plurality of memory dies 240A to 240D. Herein, a correlation operation performed by the correlation circuitry 194 may support parallel processing and distributed computing between the controller 130 and the plurality of memory dies 240A to 240D. In a circumstance where a single data path is shared by plural components, the plural components may interleave their signals or their data in the single data path. Further, in a circumstance where plural data paths are used by a single component, the single component may distribute plural signals or plural data over the plural data paths. The correlation operation may enable some of a plurality of read requests to be delivered into the plurality of memory dies in parallel through the plurality of channels, so that plural pieces of data corresponding to the plurality of read requests are outputted in parallel from the plurality of memory dies via the plurality of channels. The correlation operation for a plurality of read requests may include that plural pieces of data requested to the memory dies 240A to 240D may be transferred from the memory device 150 to the controller 130 in the interleaving way.

When a host sends requests for 20 pieces of data stored in the memory system 110, the controller 130 may receive 20 read requests for the 20 pieces of data, which are inputted from the host. The buffer control circuitry 198 may transmit 20 read requests for 20 pieces of data to the correlation circuitry 194. The correlation circuitry 194 tries to correlate 20 read requests so that at least some among 20 pieces of data are outputted in the interleaving way. For example, the correlation circuitry 194 may check a physical address corresponding to a first logical address inputted along with a first read request among 20 read requests, and then recognize that first data corresponding to the first logical address is stored in the first memory die 240A. The correlation circuitry 194 may check a physical address corresponding to a second logical address inputted along with a second read request among 20 read requests. When second data corresponding to the second read request is stored in the third memory die 240C or the fourth memory die 240D, an interleaving operation between the first and second read requests may be expected because the first data and the second data respectively corresponding to the first and second read requests may be transmitted via different channels CH1, CH2. Thus, the first and second read requests may be correlated by the correlation circuitry 194, and correlated read requests may be transmitted to the operation control circuitry 196.

However, if the second data is stored in the first memory die 240A or the second memory die 240B, the interleaving operation between the first and second read requests may not be expected because the first data and the second data respectively corresponding to the first and second read requests may be transmitted via the same channel CH1. In this case, the correlation circuitry 194 may not pair or correlate the first and second read requests. Then, the correlation circuitry 194 may check a physical address for a third read request. When third data corresponding to the third read request is stored in the third memory die 240C or the fourth memory die 240D, the interleaving operation between the first request and the third request may be expected because the first data and the third data respectively corresponding to the first and third read requests may be transmitted via different channels CH1, CH2. The correlation circuitry 194 may correlate the first read request and the third read request and transmit the correlated read request to the operation control circuitry 196. The third read request may be transmitted earlier than the second read request.

However, if the third data is stored in the first memory die 240A or the second memory die 240B, the interleaving operation between the first request and the third request may not be expected because the first and third data are transmitted via the same channel. Then, the correlation circuitry 194 may check a physical address for a fourth read request.

As described above, the correlation circuitry 194 may check a physical location where data corresponding to a read request is stored, correlate some of read requests when an interleaving operation between the read requests may be expected, and transfer correlated read requests to the operation control circuitry 196. For the correlation operation, the correlation circuitry 194 may refer to map information stored in the controller 130 or loaded in a memory (or a buffer) of the controller 130.

The correlation operation with respect to a plurality of read requests may adversely affect data input/output performance such as I/O throughput of the memory system 110 because the correlation operation may cause a delay. Accordingly, the correlation circuitry 194 may not perform the correlation operation for all read requests from the host. For example, the buffer control circuitry 198 may check pieces of data in the output buffer, which are outputted to the host, to determine whether the data input/output performance of the memory system 110 would not be degraded if the correlation circuitry 194 performs the correlation operation to the plurality of read requests. The correlation circuitry 194 may perform the correlation operation regarding the plurality of read requests in a situation where it is determined that the correlation operation has no or little influence on I/O throughput.

In addition, the correlation circuitry 194 may not correlate all of the plurality of read requests from the buffer control circuitry 198. When the interleaving operation may be expected by considering the physical locations of the pieces of data corresponding to the plurality of read requests, the correlation circuitry 194 may perform the correlation operation. But, other read requests, which are received after these read requests are correlated by the correlation circuitry 194, may be transferred uncorrelated to the operation control circuitry 196.

In response to an operation environment, the controller 130 may correlate at least some of the plurality of read requests from the host, so that plural pieces of data are transferred in the interleaving way between the memory device 150 and the controller 130. In addition, the memory system 110 does not have to adopt an address limitation structure for exchanging signals or data in the interleaving way within the memory system 110. Plural pieces of data may be distributed and stored based on operation environment and operation states of the plurality of memory dies 240A to 240D in the memory device 150. The controller 130 may attempt to correlate read requests for reading plural pieces of data stored in the plurality of memory dies 240A to 240D. Because the memory system 110 does not have to use the address limitation structure, the plurality of memory dies 240A to 240D may be operated more efficiently, and lifespans of the plurality of memory dies 240A to 240D may be improved. On the other hand, since data transfer between the plurality of memory dies 240A to 240D and the controller 130 may be performed in the interleaving way, the memory system 110 can avoid deteriorating the data input/output performance (e.g., I/O throughput) thereof.

Figure 2:
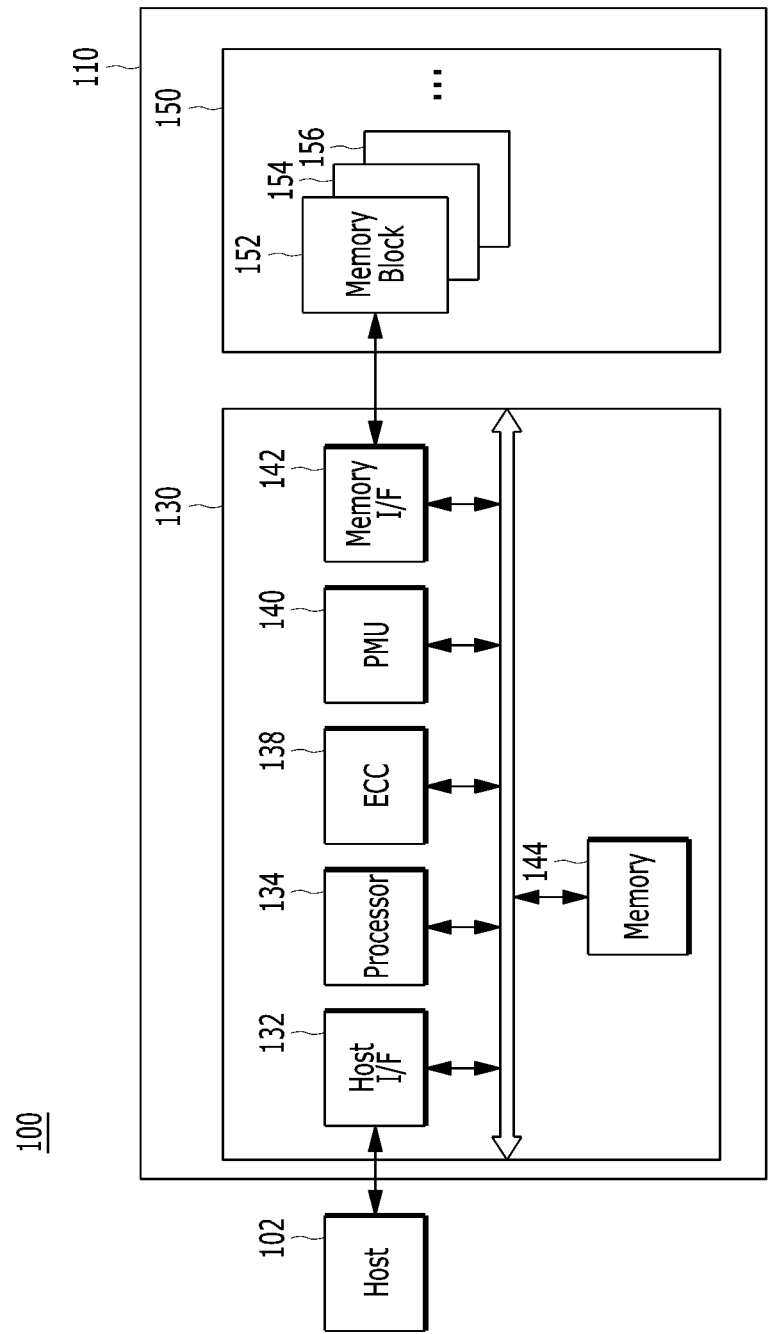
FIG. 2 illustrates a data processing system including a memory system according to an embodiment of the present invention.

FIG. 2 illustrates a data processing system 100 including a memory system according to an embodiment of the disclosure. Referring to FIG. 2, the data processing system 100 may include a host 102 engaged or operably coupled with a memory system 110.

The host 102 may include, for example, any of a variety of portable electronic devices, such as a mobile phone, an MP3 player and a laptop computer, or an electronic device such as a desktop computer, a game player, a television (TV), a projector and the like.

The host 102 also includes at least one operating system (OS), which can generally manage, and control, functions and operations performed in the host 102. The OS may provide interoperability between the host 102 engaged with the memory system 110 and the user of the memory system 110. The OS may support functions and operations corresponding to user's requests. By way of example but not limitation, the OS may include a general operating system and a mobile operating system according to mobility of the host 102. The general operating system may be split into a personal operating system and an enterprise operating system according to system requirements or a user's environment. The personal operating system, including Windows and Chrome, may be subject to support services for general purposes. The enterprise operating systems may be specialized for securing and supporting high performance, including Windows servers, Linux and Unix. Further, the mobile operating system may include an Android, an iOS and a Windows mobile. The mobile operating system may be subject to support services or functions for mobility (e.g., a power saving function). The host 102 may include a plurality of operating systems. The host 102 may execute multiple operating systems in cooperation with the memory system 110, corresponding to a user's request. The host 102 may transmit a plurality of commands corresponding to the user's requests into the memory system 110, thereby performing operations corresponding to commands within the memory system 110. Handling plural commands in the memory system 110 is described below with reference to FIGS. 3 and 4.

The memory system 110 may perform a specific function or operation in response to a request from the host 102 and, particularly, may store data to be accessed by the host 102. The memory system 110 may be used as a main memory system or an auxiliary memory system of the host 102. The memory system 110 may be implemented with any one of various types of storage devices, which may be electrically coupled with the host 102, according to a protocol of a host interface. Non-limiting examples of suitable storage devices include a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card and a memory stick.

The storage devices for the memory system 110 may be implemented with a volatile memory device, for example, a dynamic random access memory (DRAM) or a static RAM (SRAM), and/or a nonvolatile memory device such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM or ReRAM) or a flash memory.

The memory system 110 may include a controller 130 and a memory device 150. The memory device 150 may store data to be accessed by the host 102. The controller 130 may control storage of data in the memory device 150.

The controller 130 and the memory device 150 may be integrated into a single semiconductor device, which may be included in any of the various types of memory systems as exemplified above.

By way of example but not limitation, the controller 130 and the memory device 150 may be integrated into a single semiconductor device. The controller 130 and memory device 150 may be integrated to form an SSD for improving operation speed. When the memory system 110 is used as an SSD, the operating speed of the host 102 connected to the memory system 110 can be improved more than that of a host 102 connected with a hard disk. In another embodiment, the controller 130 and the memory device 150 may be integrated into one semiconductor device to form a memory card, such as a PC card (PCMCIA), a compact flash card (CF), a smart media card (e.g., SM, SMC), a memory stick, a multimedia card (e.g., MMC, RS-MMC, MMCmicro), a secure digital (SD) card (e.g., SD, miniSD, microSD, SDHC), or a universal flash memory.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device and may retain data stored therein even while electrical power is not supplied. The memory device 150 may store data provided from the host 102 through a write operation, and provide data stored therein to the host 102 through a read operation. The memory device 150 may include a plurality of memory blocks 152, 154, 156, each of which may include a plurality of pages. Each of the plurality of pages may include a plurality of memory cells to which a plurality of word lines (WL) are electrically coupled. The memory device 150 also includes a plurality of memory dies, each of which includes a plurality of planes, each of which includes memory blocks, among the plurality of memory blocks 152, 154, 156. In addition, the memory device 150 may be a non-volatile memory device, for example a flash memory, wherein the flash memory may be a three-dimensional stack structure.

The controller 130 may control overall operations of the memory device 150, such as read, write, program, and erase operations. For example, the controller 130 may control the memory device 150 in response to a request from the host 102. The controller 130 may provide the data, read from the memory device 150, with the host 102. The controller 130 may store the data, provided by the host 102, into the memory device 150.

The controller 130 may include a host interface (I/F) 132, a processor 134, an error correction code (ECC) circuitry 138, a power management unit (PMU) 140, a memory interface (I/F) 142 and a memory 144, all operatively coupled via an internal bus.

The host interface 132 may process commands and data provided from the host 102, and may communicate with the host 102 through at least one of various interface protocols, such as universal serial bus (USB), multimedia card (MMC), peripheral component interconnect-express (PCI-e or PCIe), small computer system interface (SCSI), serial-attached SCSI (SAS), serial advanced technology attachment (SATA), parallel advanced technology attachment (PATA), small computer system interface (SCSI), enhanced small disk interface (ESDI) and integrated drive electronics (IDE). In accordance with an embodiment, the host interface 132 is a component for exchanging data with the host 102, which may be implemented through firmware called a host interface layer (HIL).

The ECC circuitry 138 may correct error bits of the data to be processed in (e.g., outputted from) the memory device 150, which may include an ECC encoder and an ECC decoder. Here, the ECC encoder may perform error correction encoding of data to be programmed in the memory device 150 to generate encoded data into which a parity bit is added and store the encoded data in memory device 150. The ECC decoder may detect and correct errors contained in a data read from the memory device 150 when the controller 130 reads the data stored in the memory device 150. In other words, after performing error correction decoding on the data read from the memory device 150, the ECC circuitry 138 may determine whether the error correction decoding has succeeded and output an instruction signal (e.g., a correction success signal or a correction fail signal). The ECC circuitry 138 may use the parity bit which is generated during the ECC encoding process, for correcting the error bit of the read data. When the number of the error bits is greater than or equal to a threshold number of correctable error bits, the ECC circuitry 138 may not correct error bits but instead may output an error correction fail signal indicating failure in correcting the error bits.

The ECC circuitry 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), or a Block coded modulation (BCM). The ECC circuitry 138 may include any and all circuits, modules, systems or devices for performing the error correction operation based on at least one of the above described codes.

The PMU 140 may manage electrical power provided in the controller 130. For example, the PMU 140 may detect power-on and power-off of the memory system 110. In addition, the PMU 140 may include a power detector.

The memory interface 142 may serve as an interface for handling commands and data transferred between the controller 130 and the memory device 150, to allow the controller 130 to control the memory device 150 in response to a request delivered from the host 102. The memory interface 142 may generate a control signal for the memory device 150 and may process data entered into or outputted from the memory device 150 under the control of the processor 134 in a case when the memory device 150 is a flash memory and, in particular, when the memory device 150 is a NAND flash memory. The memory interface 142 may provide an interface for handling commands and data between the controller 130 and the memory device 150, for example, operations of NAND flash interface, in particular, operations between the controller 130 and the memory device 150. In accordance with an embodiment, the memory interface 142 may be implemented through firmware called a flash interface layer (FIL) as a component for exchanging data with the memory device 150.

The memory 144 may support operations performed by the memory system 110 and the controller 130. The memory 144 may store temporary or transactional data generated or delivered for operations in the memory system 110 and the controller 130. The controller 130 may control the memory device 150 in response to a request from the host 102. The controller 130 may deliver data read from the memory device 150 into the host 102. The controller 130 may store data entered through the host 102 within the memory device 150. The memory 144 may be used to store data required for the controller 130 and the memory device 150 to perform operations such as read operations or program/write operations.

The memory 144 may be implemented with a volatile memory. The memory 144 may be implemented with a static random access memory (SRAM), a dynamic random access memory (DRAM) or both. Although FIG. 2 exemplifies the memory 144 disposed within the controller 130, the present invention is not limited to that arrangement. That is, the memory 144 may be within or external to the controller 130. For instance, the memory 144 may be embodied by an external volatile memory having a memory interface transferring data and/or signals between the memory 144 and the controller 130.

The memory 144 may store data for performing operations such as data writing and data reading requested by the host 102 and/or data transfer between the memory device 150 and the controller 130 for background operations such as garbage collection and wear levelling as described above. In accordance with an embodiment, for supporting operations in the memory system 110, the memory 144 may include a program memory, a data memory, a write buffer/cache, a read buffer/cache, a data buffer/cache and a map buffer/cache.

The processor 134 may be implemented with a microprocessor or a central processing unit (CPU). The memory system 110 may include one or more processors 134. The processor 134 may control the overall operations of the memory system 110. By way of example but not limitation, the processor 134 can control a program operation or a read operation of the memory device 150, in response to a write request or a read request entered from the host 102. In accordance with an embodiment, the processor 134 may use or execute firmware to control the overall operations of the memory system 110. Herein, the firmware may be a flash translation layer (FTL). The FTL may serve as an interface between the host 102 and the memory device 150. The host 102 may transmit requests for write and read operations to the memory device 150 through the FTL.

The FTL may manage operations of address mapping, garbage collection, wear-leveling and so forth. Particularly, the FTL may load, generate, update, or store map data. Therefore, the controller 130 may map a logical address, which is entered from the host 102, with a physical address of the memory device 150 through the map data. The memory device 150 may otherwise function as a general storage device to perform a read or write operation because of the address mapping operation. Also, through the address mapping operation based on the map data, when the controller 130 tries to update data stored in a particular page, the controller 130 may program the updated data on another empty page and may invalidate old data of the particular page (e.g., update a physical address, corresponding to a logical address of the updated data, from the particular page to the newly programed page) due to a characteristic of a flash memory device. Further, the controller 130 may store map data of the new data into the FTL.

For example, when performing an operation requested from the host 102 in the memory device 150, the controller 130 uses the processor 134. The processor 134 engaged with the memory device 150 may handle instructions or commands corresponding to an inputted command from the host 102. The controller 130 may perform a foreground operation as a command operation, corresponding to an command from the host 102, such as a program operation corresponding to a write command, a read operation corresponding to a read command, an erase/discard operation corresponding to an erase/discard command and a parameter set operation corresponding to a set parameter command or a set feature command with a set command.

For another example, the controller 130 may perform a background operation on the memory device 150 through the processor 134. By way of example but not limitation, the background operation for the memory device 150 includes copying data in a memory block, among the memory blocks 152, 154, 156, and storing such data in another memory block (e.g., a garbage collection (GC) operation). The background operation may include an operation to move data stored in at least one of the memory blocks 152, 154, 156 in the memory device 150, into at least another of the memory blocks 152, 154, 156 (e.g., a wear leveling (WL) operation). During a background operation, the controller 130 may use the processor 134 for storing the map data stored in the controller 130 to at least one of the memory blocks 152, 154, 156, e.g., a map flush operation. A bad block management operation of checking for bad blocks among the plurality of memory blocks 152, 154, 156 is another example of a background operation performed by the processor 134.

In the memory system 110, the controller 130 performs a plurality of command operations corresponding to a plurality of commands received from the host 102. For example, when performing a plurality of program operations corresponding to plural program commands, a plurality of read operations corresponding to plural read commands and a plurality of erase operations corresponding to plural erase commands sequentially, randomly or alternatively, the controller 130 may determine which channel(s) or way(s) for connecting the controller 130 to which memory die(s) in the memory 150 is/are proper or appropriate for performing each operation. The controller 130 may send or transmit data or instructions via the determined channel(s) or way(s) for performing each operation. The plurality of memory dies may transmit an operation result via the same channel(s) or way(s), respectively, after each operation is complete. Then, the controller 130 may transmit a response or an acknowledge signal to the host 102. In an embodiment, the controller 130 may check a status of each channel or each way. In response to a command received from the host 102, the controller 130 may select at least one channel or way based on the status of each channel or each way so that instructions and/or operation results with data may be delivered via selected channel(s) or way(s).

By way of example but not limitation, the controller 130 may recognize statuses regarding channels (or ways) related to memory dies in the memory device 150. The controller 130 may determine each channel or each way as being in a busy state, a ready state, an active state, an idle state, a normal state, or an abnormal state. The controller's determination of which channel or way an instruction (and/or a data) is delivered through can be based on a physical block address, e.g., to which die(s) the instruction (and/or the data) is delivered. The controller 130 may refer to descriptors delivered from the memory device 150. The descriptors may include a block or page of parameters that describe informative items about the memory device 150, which is a data with a set format or structure. For instance, the descriptors may include device descriptors, configuration descriptors, unit descriptors, and the like. The controller 130 can refer to, or use, the descriptors to determine which channel(s) or way(s) an instruction or a data is exchanged.

A management unit (not shown) may be included in the processor 134. The management unit may perform bad block management of the memory device 150. The management unit may find bad memory blocks, which are in unsatisfactory condition for further use, as well as perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. The bad blocks may seriously aggravate the utilization efficiency of the memory device 150 having a 3D stack structure and the reliability of the memory system 110. Thus, reliable bad block management may enhance or improve performance of the memory system 110.

Figure 3:
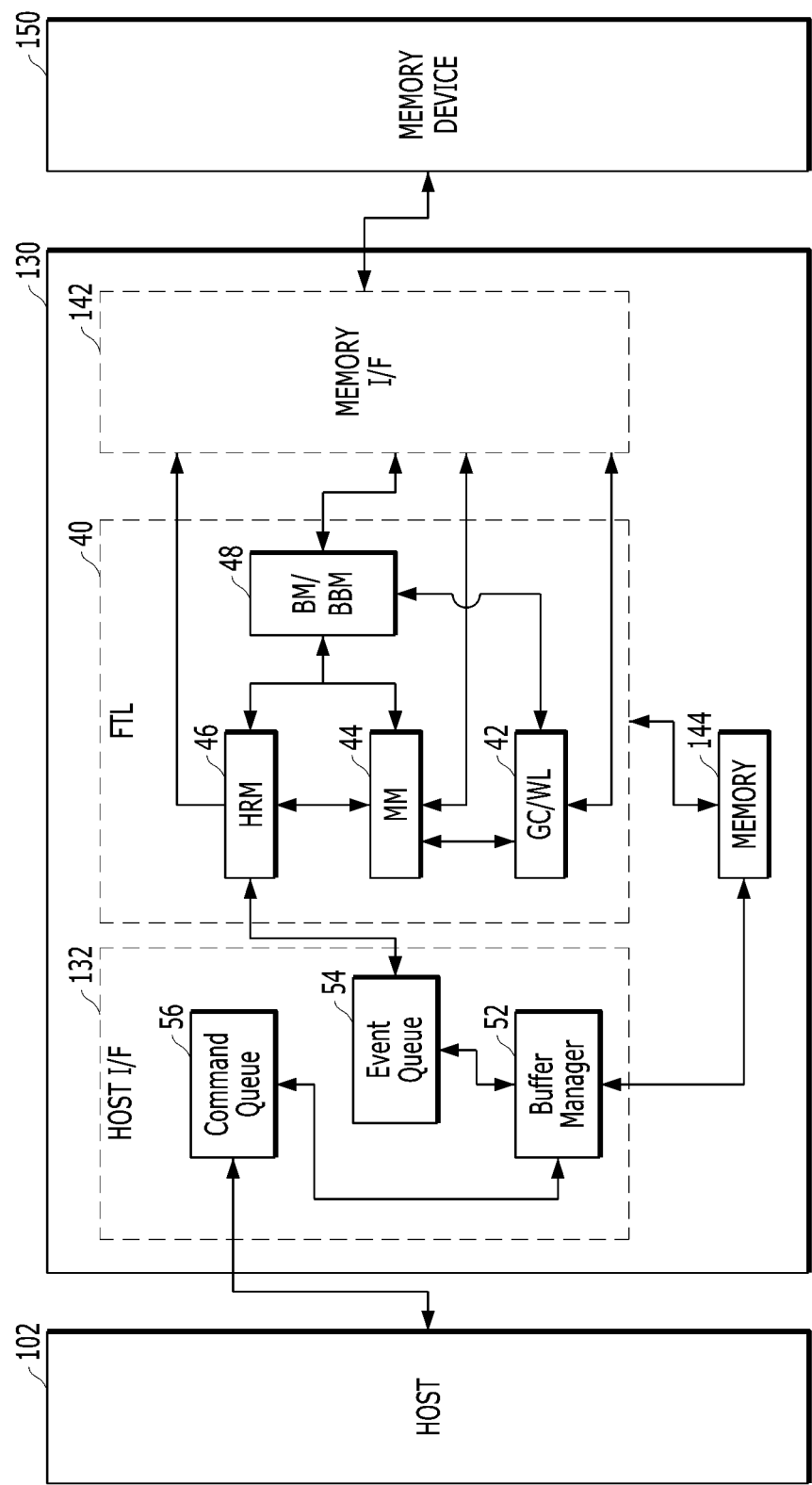
FIG. 3 illustrates a controller in a memory system according to an embodiment of the present invention.

FIG. 3 illustrates a controller 130 in a memory system according to an embodiment of the disclosure. Referring to FIG. 3, the controller 130 cooperates with the host 102 and the memory device 150. The controller 130 may include a host interface (I/F) 132, a flash translation layer (FTL) circuitry 40, a memory interface (I/F) 142 and a memory 144.

Although not shown in FIG. 3, in accordance with an embodiment, the ECC circuitry 138 in FIG. 2 may be included in the flash translation layer circuitry 40. In another embodiment, the ECC circuitry 138 may be implemented as a separate module, a circuit, or firmware, which is included in, or related to, the controller 130.

The host interface 132 is for handling commands and data from the host 102. By way of example but not limitation, the host interface 132 may include a command queue 56, a buffer manager 52 and an event queue 54. The command queue 56 may sequentially store commands and data from the host 102 and output them to the buffer manager 52 in a stored order. The buffer manager 52 may classify, manage or adjust the commands and the data, which are delivered from the command queue 56. The event queue 54 may sequentially transmit events for processing the commands and the data, from the buffer manager 52.

A plurality of commands or data of the same characteristic may be continuously received from the host 102, or commands and data of different characteristics may be transmitted to the memory system 110 after being mixed or jumbled. For example, a plurality of commands for reading data (i.e., read commands) may be delivered, or read commands and program/write commands may be alternately transmitted to the memory system 110. The host interface 132 may store commands and data, which are received from the host 102, to the command queue 56 sequentially. Thereafter, the host interface 132 may estimate or predict what type of internal operation the controller 130 will perform according to the characteristics of the command and data, which is received from the host 102. The host interface 132 may determine a processing order and a priority of commands and data, based at least on their characteristics. According to characteristics of commands and data, from the host 102, the buffer manager 52 is configured to determine whether the buffer manager 52 should store commands and data in the memory 144, or whether the buffer manager 52 should deliver the commands and the data into the flash translation layer circuitry 40. The event queue 54 receives events, entered from the buffer manager 52, which are to be internally executed and processed by the memory system 110 or the controller 130 in response to the commands and the data from the host 102, so as to deliver the events into the flash translation layer circuitry 40 in the order received.

In accordance with an embodiment, the host interface 132 in FIG. 3 may perform the functions of the controller 130 in FIGS. 1 and 2.

In accordance with an embodiment, the flash translation layer circuitry 40 may include a state manager (GC/WL) 42, a map manager (MM) 44, a host request manager (HRM) 46, and a block manager (BM/BBM) 48. The host request manager 46 may manage the events entered from the event queue 54. The map manager 44 may handle or control map data. The state manager 42 may perform garbage collection (GC) or wear leveling (WL). The block manager 48 may execute commands or instructions onto a block in the memory device 150.

By way of example but not limitation, the host request manager 46 may use the map manager 44 and the block manager 48 to handle or process requests according to the read and program commands, and events which are delivered from the host interface 132. The host request manager 46 may send an inquiry request to the map data manager 44, to determine a physical address corresponding to the logical address which is entered with the events. The host request manager 46 may send a read request with the physical address to the memory interface 142, to process the read request (handle the events). On the other hand, the host request manager 46 may send a program request (or write request) to the block manager 48, to program entered data to an empty page (i.e., a page having no data) in the memory device 150, and then, may transmit a map update request corresponding to the program request to the map manager 44, to update an item relevant to the programmed data in information of mapping the logical-physical addresses to each other.

Here, the block manager 48 may convert a program request delivered from the host request manager 46, the map data manager 44, and/or the state manager 42 into a flash program request used for the memory device 150, to manage flash blocks in the memory device 150. In order to maximize or enhance program or write performance of the memory system 110 (see FIG. 2), the block manager 48 may collect program requests and send flash program requests for multiple-plane and one-shot program operations to the memory interface 142. The block manager 48 may send several flash program requests to the memory interface 142 to enhance parallel processing of the multi-channel and multi-directional flash controller.

The block manager 48 may be configured to manage blocks in the memory device 150 according to the number of valid pages, select and erase blocks having no valid pages when a free block is needed, and select a block including the least number of valid pages when it is determined that garbage collection is necessary. The state manager 42 may perform garbage collection to move the valid data to an empty block and erase remaining data in the blocks from which the valid data was moved so that the block manager 48 may have enough free blocks (i.e., empty blocks with no data). If the block manager 48 provides information regarding a block to be erased to the state manager 42, the state manager 42 is able to check all flash pages of the block to be erased to determine whether each page is valid. For example, to determine validity of each page, the state manager 42 may identify a logical address stored in an out-of-band (00B) area of each page. To determine whether each page is valid, the state manager 42 may compare the physical address of the page with the physical address mapped to the logical address obtained from the request. The state manager 42 sends a program request to the block manager 48 for each valid page. A mapping table may be updated through the update of the map manager 44 when the program operation is complete.

The map manager 44 may manage a logical-to-physical mapping table. The map manager 44 may process requests such as queries and updates, which are generated by the host request manager 46 or the state manager 42. The map manager 44 may store the entire mapping table in the memory device 150 (e.g., a flash/non-volatile memory) and cache mapping entries according to the storage capacity of the memory 144. When a map cache miss occurs while processing inquiry or update requests, the map manager 44 may send a read request to the memory interface 142 to load a relevant mapping table stored in the memory device 150. When the number of dirty cache blocks in the map manager 44 exceeds a certain threshold, a program request may be sent to the block manager 48 so that a clean cache block is made and the dirty map table may be stored in the memory device 150.

When garbage collection is performed, the state manager 42 copies valid page(s) into a free block, and the host request manager 46 may program the latest version of the data for the same logical address of the page and currently issue an update request. When the state manager 42 requests the map update in a state in which copying of valid page(s) has not been completed, the map manager 44 may not perform the mapping table update. This is because the map request is issued with old physical information if the state manger 42 requests a map update and a valid page copy is not completed until later. The map manager 44 may perform a map update operation to ensure accuracy only if the latest map table still points to the old physical address.

In accordance with an embodiment, the flash translation layer circuitry 40 may include the correlation circuitry 194 shown in FIG. 1, and the memory interface 142 may include the operation control circuitry 196 and the buffer control circuitry 198 shown in FIG. 1. In another embodiment, the memory interface 142 includes the correlation circuitry 194, the operation control circuitry 196 and the buffer control circuitry 198 shown in FIG. 1.

The memory device 150 may include a plurality of memory blocks. Each of the plurality of memory blocks may be a single level cell (SLC) memory block or a multi level cell (MLC) memory block, according to the number of bits that can be stored or represented in one memory cell of such block. Here, the SLC memory block includes a plurality of pages implemented by memory cells, each storing one bit of data. The SLC memory block can have high data I/O operation performance and high durability. The MLC memory block includes a plurality of pages implemented by memory cells, each storing multi-bit data (e.g., two bits or more). The MLC memory block can have a larger storage capacity for the same space compared to the SLC memory block. The MLC memory block can be highly integrated in terms of storage capacity. In an embodiment, the memory device 150 may be implemented with MLC memory blocks, such as a double level cell memory block, a triple level cell (TLC) memory block, a quadruple level cell (QLC) memory block and a combination thereof. The double level memory block may include a plurality of pages implemented by memory cells, each capable of storing 2-bit data. The triple level cell (TLC) memory block may include a plurality of pages implemented by memory cells, each capable of storing 3-bit data. The quadruple level cell (QLC) memory block may include a plurality of pages implemented by memory cells, each capable of storing 4-bit data. In another embodiment, the memory device 150 may be implemented with a block including a plurality of pages implemented by memory cells, each capable of storing 5-bit or more bit data.

In an embodiment of the disclosure, the memory device 150 is embodied as a nonvolatile memory such as a flash memory such as a NAND flash memory, a NOR flash memory and the like. In another embodiment, the memory device 150 may be implemented by at least one of a phase change random access memory (PCRAM), a ferroelectrics random access memory (FRAM) and a spin injection magnetic memory (e.g., a spin transfer torque magnetic random access memory (STT-MRAM)).

Figure 4:
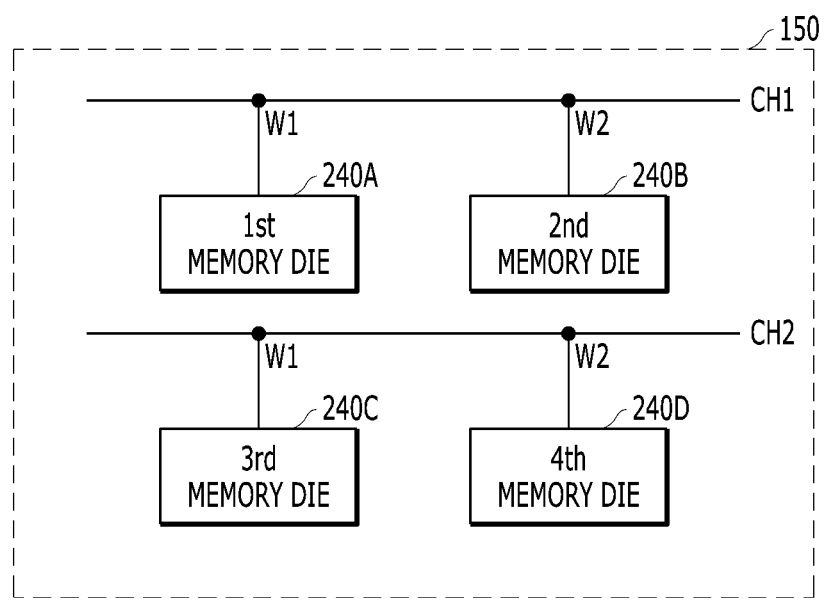
FIG. 4 illustrates a memory device in a memory system according to an embodiment of the present invention.

FIG. 4 illustrates a memory device 150 in a memory system in accordance with an embodiment of the invention. More specifically, FIG. 4 illustrates an internal configuration of the memory device 150.

Referring to FIG. 4, the memory device 150 may include the plurality of memory dies 240A, 240B, 240C, 240D. The first memory die 240A and the second memory die 240B may be coupled to the controller 130 through the first channel CH1. The third memory die 240C and the fourth memory die 240D may be connected to the controller 130 through the second channel CH2.

In FIG. 4, a configuration in which four memory dies 240A, 240B, 240C, 240D are coupled to the controller 130 through two channels CH1, CH2 is described. However, the invention should be not limited to that or any particular configuration of dies and channels. Even though the memory device 150 may include at least two dies and at least two channels, the number of dies and channels in a given configuration depends on various factors, such as the overall configuration of the memory system, the purpose(s) for which it is employed and the specification defining communication between the memory system and the engaged host.

When a plurality of memory dies is connected to a single channel, each memory die may be coupled with the channel through different ways. In FIG. 4, the first memory die 240A and the second memory die 240B may be coupled with the first channel CH1 through the first way W1 and the second way W2, individually. The third memory die 240C and the fourth memory die 240D may be coupled with the second channel CH2 through the first way W1 and the second way W2, individually. In this particular configuration, the number of ways is the same as the number of memory dies.

Figure 5A:
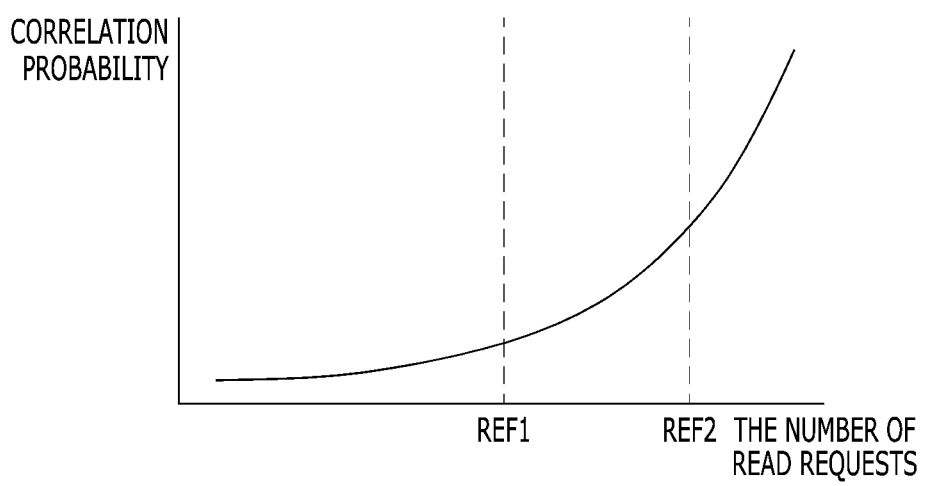
FIGS. 5A and 5B illustrate characteristics of a correlation operation performed by a controller according to an embodiment of the present invention.
Figure 5B:
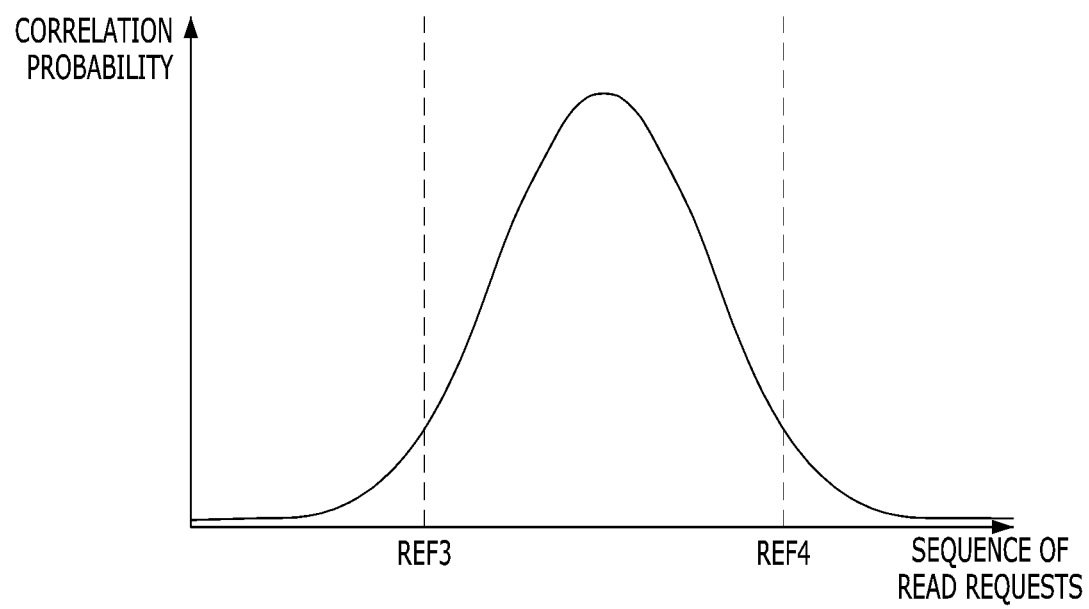

FIGS. 5A and 5B illustrate characteristics of the correlation operation performed by the controller 130. Specifically, the two graphs in FIGS. 5A and 5B may illustrate a result obtained by performing the correlation operation repeatedly under an unspecified and random situation.

Referring to FIG. 5A, as the correlation circuitry 194 in the controller 130 of FIG. 1 tries to perform the correlation operation for an increasing number of read requests, a probability of correlating such read requests increases as the read requests increase. For example, the correlation probability of 20 read requests is greater than that of 5 read requests.

When there is no address limitation in a memory system, physical locations in the memory device 150 corresponding to logical addresses delivered with a few read requests may not be distributed. In this case, the number of read requests correlated by the correlation circuitry 194 may be small. However, when a large number of read requests are transmitted to the memory system 110, the probability that the read requests are correlated is higher. For example, the correlation probability may be higher when the number of read requests is the second reference value REF2 compared to when the number of read requests is the first reference value REF1, which is less than the second reference value REF2.

Referring to FIG. 5B, when a plurality of read requests are sequentially transmitted to the correlation circuitry 194, the correlation probability according to an input time (or input sequence) of the read requests is described. As described with reference to FIG. 4, there are two channels between the controller 130 and the memory device 150. For example, a first read request sent to the correlation circuitry 194 may not be correlated because there are no other read requests which are ready to be correlated. When a second read request is delivered to the correlation circuitry 194, the second read request may or may not be correlated with the first read request; the probability is 50:50. When a third read request is delivered to the correlation circuitry 194, the correlation circuitry 194 may attempt to correlate the third read request with the first and second read requests if the first and second read requests are not correlated. Thus, the correlation probability may be higher at the time when the third read request is delivered than at the time when the second read request is delivered. Based on these characteristics, the correlation circuitry 194 may distinguish states before and after a specific read request is received. For example, after a read request (corresponding to third reference value REF3) is received, the correlation circuitry 194 may determine that a probability of correlation is sufficiently high, and attempt to perform the correlation operation on the previously-received read request(s) together with the (REF3)th read request. In contrast, before the (REF3)th read request is received, the correlation circuitry 194 may determine that a correlation probability is too low, and thus skip performing the correlation operation on the read requests received before the third reference value REF3 read request.

In another example, 20 read requests are delivered. When 19th and 20th read requests are inputted, the correlation probability may be lower when 9th to 11th read requests are inputted. This is because, when 19th and 20th read requests are inputted, the previously inputted read requests, i.e., 1st to 18th read requests, may have been already correlated and outputted to the operation control circuitry 196. As the correlated read requests are transferred after a certain time passes, the correlation probability may be lowered. After the correlation probability becomes lowered, it is unlikely that the correlation probability increases again if a new read request is not delivered. In order for the correlation circuitry 194 to avoid wasting resources (for example, time, operation margin, or power) to perform the correlation operation, the correlation operation may be stopped or halted at a time when the read request corresponding to a fourth reference value REF4 is transmitted.

In an embodiment, the correlation circuitry 194 may stop the correlation operation in response to the number of uncorrelated read requests. For example, if a small number of uncorrelated read requests, e.g., two or three, remain, among the 20 read requests, the correlation circuitry 194 may output the uncorrelated read requests to the operation control circuitry 196 without holding them for a next correlation operation. When the correlation circuitry 194 holds a few read requests for performing a next correlation operation, the data input/output performance (e.g., I/O throughput) of the memory system 110 may be deteriorated.

FIG. 6 illustrates an internal configuration of the controller 130 according to an embodiment of the invention.

Referring to FIG. 6, the controller 130 may include the correlation circuitry 194, the operation control circuitry 196 and the buffer control circuitry 198. For example, the buffer control circuitry 198, the correlation circuitry 194, and the operation control circuitry 196 may be operatively engaged with an output buffer 186, an input buffer 184 and a map memory 182 to proceed with or stop the correlation operation.

The controller 130 may include the output buffer 186, the input buffer 184, and the map memory 182. According to an embodiment, the output buffer 186, the input buffer 184, and the map memory 182 may be functional modules that may be implemented with the memory 144 described with reference to FIGS. 2 to 3. The output buffer 186, the input buffer 184, and the map memory 182 may be implemented with a single volatile memory device or plural, separate volatile memory devices. In an embodiment, the output buffer 186, the input buffer 184 and the map memory 182 may be implemented with a plurality of cache memories.

For example, each of the output buffer 186 and the input buffer 184 may have a data structure such as a queue. In this case, the output buffer 186 and the input buffer 184 may output a piece of data according to the stored order of data (e.g., first-in first-out, FIFO). The map memory 182 may have various structures according to map data, storage structure, and management rule regarding map information.

The controller 130 may translate a logical address, which is an address inputted from the host 102, into a physical address indicating a physical location in the memory device 150. The controller 130 may load the map data and the map information stored in the memory device 150 for performing address translation.

According to an embodiment, when there is a sufficient storage space in the memory 144 which is included in the controller 130 or operably engaged with the controller 130, all map data, or all map information, used for address translation may be loaded once. However, in a case when the memory system 110 is mounted in a portable terminal, it may be difficult for the controller 130 to have sufficient storage space for storing all of the map data or all of the map information. In this case, the controller 130 may retrieve specific map data, i.e., some map data, from the memory device 150, use or update the retrieved map data, store updated map data in the memory device 150, and retrieve other map data stored in the memory device 150. According to an embodiment, a pre-allocated space in the memory 144 may be utilized for storing map data or map information.

In an example, if the requested map data cannot be stored in a region of the memory 144, the controller 130 may remove the least recently used (LRU) map data in the region based on an LRU replacement scheme. In another example, when the requested map data cannot be stored in the region of the memory 144, the controller 130 may remove the least frequently used (LFU) map data in the region based on an LFU replacement scheme. The controller 130 requests the map data or the map information for performing address translation from the memory device 150, which incurs overhead, so that overall performance or I/O throughput of the memory system 110 may be degraded. Thus, it is desirable to avoid unnecessary replacement of map data and map information.

For example, when there are 20 read requests for correlation, the controller 130 may check the map memory 182 based on logical addresses related to the 20 read requests. When map addresses or map data relevant to 11 read requests are found in the map memory 182, and the map data or the map addresses relevant to 9 read requests are not found in the map memory 182, the controller 130 may load map data or map addresses relevant for 9 read requests from the memory device 150 into the map memory 182. According to an embodiment, when a storage space of the map memory 182 is not sufficient, the correlation circuitry 194 may first perform the correlation operation with respect to the 11 read requests of which map addresses or map data has been loaded in the map memory 182.

The correlation operation performed by the correlation circuitry 194 may be considered overhead in view of data input/output performance (e.g., I/O throughput) of the memory system 110. Accordingly, when the operation control circuitry 196 is in an idle state, it may be desirable for the correlation circuitry 194 not to perform the correlation operation to all read requests. Without the correlation operation, the correlation circuitry 194 transfers at least one read request to the operation control circuitry 196, so that the operation control circuitry 196 may transition to an operational state from the idle state. Based on the characteristics of the correlation operation described with reference to FIGS. 5A and 5B, the correlation circuitry 194 may determine whether to proceed or stop the correlation operation. For example, when the number of read requests is less than the first reference value REF1, the correlation circuitry 194 may not perform the correlation operation on the read requests. In addition, a first read request transmitted to the correlation circuitry 194 may be transferred to the operation control circuitry 196 without the correlation operation. Furthermore, when the number of read requests remaining in the correlation circuitry 194 is less than a set threshold, the correlation circuitry 194 may stop or halt the correlation operation.

Figure 7:
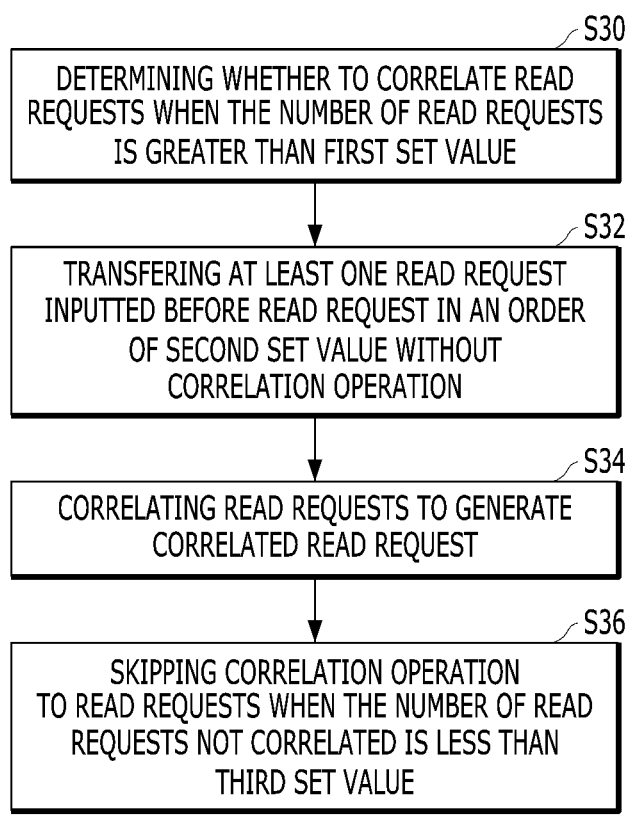
FIG. 7 illustrates a process for correlating plural read requests in a controller according to an embodiment of the present invention.

FIG. 7 illustrates a correlation operation method of a controller 130 according to an embodiment of the disclosure. According to an embodiment, the correlation operation may be performed by the correlation circuitry 194 in the controller 130.

Referring to FIG. 7, the method of performing the correlation operation may include determining whether to correlate read requests when the number of read requests is greater than a first set value (S30), transferring at least one read request having a reception order lower than a second set value, without the correlation operation (S32), correlating the read requests to generate correlated a read request (S34), and skipping the correlation operation to the read requests when the number of uncorrelated read requests is less than a third set value (S36).

In some embodiments, the first set value, the second set value, and the third set value may be determined based on the numbers of memory dies and channels in the memory system 110. In addition, the first set value, the second set value, and the third set value may be determined based on the characteristics of the correlation operation described with the graphs of FIGS. 5A and 5B. For example, the first set value may be the first reference value REF1, the second set value may be the third reference value REF3, and the third set value may be the fourth reference value REF4. Also, the first set value, the second set value, and the third set value may be adjusted based on a success rate of the correlation operation, which may be accumulatively monitored and tracked. These set values may be considered thresholds.

As shown FIGS. 5A and 5B, even when a plurality of read requests are received for the correlation operation, the correlation probability may be low when the number of read requests is small. For example, when the number of channels in the memory system 110 is two and the correlation operation is performed for three read requests, it is possible that two read requests may be correlated but one read request may not be correlated. In addition, when an unsuccessful attempt is made to correlate all three read requests, the data input/output performance of the memory system 110 may be degraded because of the time consumed by the attempted correlation operation. To solve this issue, according to an embodiment, a process for performing the correlation operation may include determining whether to attempt the correlation operation in response to the number of read requests transmitted for the correlation operation (S30). The first set value may be determined based on the number of channels.

In addition, even if the number of read requests transferred is greater than the first set value and the controller 130 determines to perform the correlation operation, the data input/output performance of the memory system 110 may be degraded when the operation control circuitry 196 of FIGS. 1 and 6 is in an idle state. Therefore, even if a plurality of read requests are transmitted, a read request having a transmitted order number lower than the second set value may be transferred to the operation control circuitry 196 without the correlation operation (S32). For example, the correlation operation can be performed for 20 read requests. If the operation control circuitry 196 is in the idle state, the correlation circuitry 194 may transfer the first or second read request among the 20 read requests into the operation control circuitry 196 without performing the correlation operation. That is, the correlation circuitry 194 does not attempt to correlate the first or second read request. According to an embodiment, the second set value may be less than or equal to the number of channels in the memory system 110.

The controller 130 may perform the correlation operation with respect to the transferred read request (S34). For example, the correlation circuitry 194 receives 20 read requests, and transfers the first and second read requests to the operation control circuitry 196 without performing the correlation operation. While the correlation circuitry 194 performs the correlation operation for the remaining 18 read requests, the operation control circuitry 196 may perform address translations for the first or second read requests and transfer the first and second read requests to one or two memory dies among the plurality of memory dies in the memory device 150. While the operation control circuitry 196 handles the first and second read requests, the correlation circuitry 194 may have an operation margin for performing the correlation operation to at least some of the remaining 18 read requests.

The controller 130 may not perform the correlation operation when the number of uncorrelated read requests is less than the third set value (S36). In other words, the controller 130 may skip the correlation operation in that case. For example, three read requests are still uncorrelated in the process of performing the correlation operation on the 18 read requests. When the correlation circuitry 194 holds three uncorrelated read requests to correlate with another read request inputted later, the operation control circuitry 196 may be in an idle state. In this case, the data input/output performance of the memory system 110 may be degraded. When the number of uncorrelated read requests is less than the third set value, the correlation circuitry 194 may stop the correlation operation on the remaining uncorrelated read requests. According to an embodiment, the third set value may be greater than the number of channels in the memory system 110 and/or less than or equal to the number of memory dies.

The controller 130 may store a correlation rate resulting from the correlation operation (for example, a ratio of correlated read requests to total transferred read requests). For example, the correlation rate may be obtained by dividing the number of correlated read requests by the number of read requests delivered for correlation. The controller 130 may calculate the correlation rate and store the correlation rate in the memory 144 in FIG. 2. As shown in FIG. 5A, the correlation rate may be estimated based on the number of read requests transmitted for the correlation operation. According to an embodiment, the controller 130 may stop the correlation operation when the correlation rate reaches a set value based on the number of read requests for the correlation operation. In this case, even though the controller 130 may perform the correlation operation to deliver a correlated read request, overhead caused by the correlation operation may affect the data input/output performance of the memory system 110.

Figure 8:
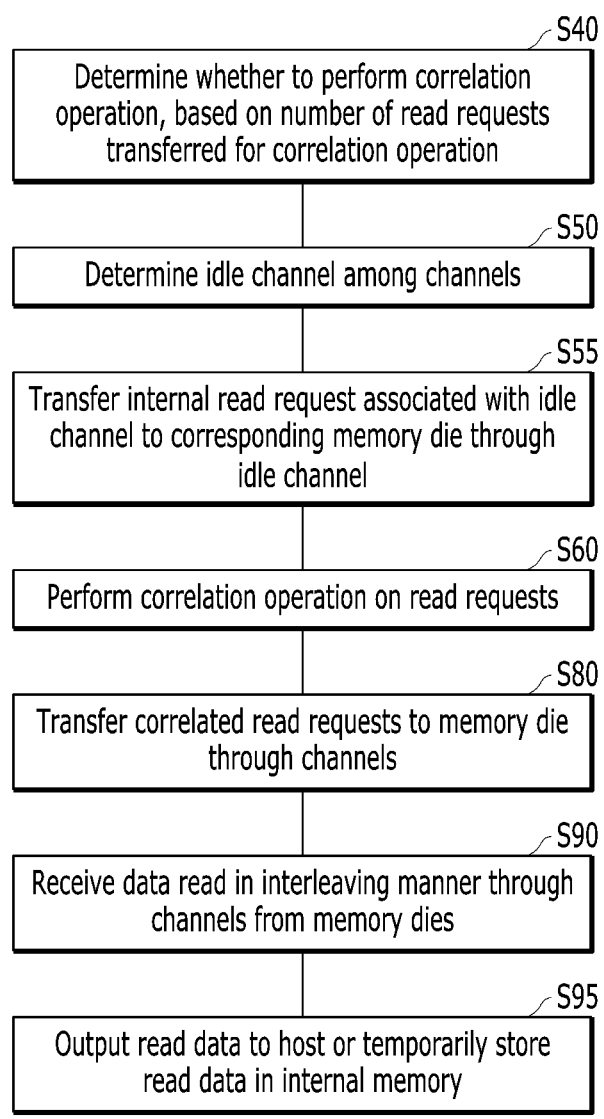
FIG. 8 illustrates an operation method of a memory system in accordance with a first embodiment of the present invention.

FIG. 8 illustrates an example of a method in which the controller 130 in accordance with an embodiment performs a correlation operation. In an embodiment, the correlation operation may be performed by the correlation circuitry 194 in the controller 130.

The correlation operation may include an operation of correlation for a plurality of read requests such that data are outputted in an interleaving way through the plurality of channels from the memory dies coupled to the respective channels. For example, the correlation operation may include an operation of correlation read requests related to physical locations where the interleaving operation is possible, among the plurality of read requests. The physical locations where the interleaving operation is possible may include physical locations to/from which data can be transmitted/received in parallel through different channels.

Referring to FIG. 8, the operation method of the memory system may include determining whether to perform a correlation operation, based on the number of read requests transferred for the correlation operation (step S40); determining an idle channel among a plurality of channels (step S50); transferring an internal read request associated with the idle channel to a corresponding memory die through the idle channel (step S55); performing a correlation operation on the plurality of read requests (step S60); performing address translation on the correlated read requests, and transferring the correlated read requests to a plurality of memory dies through the plurality of channels (step S80); receiving, from the plurality of memory dies, data for the correlated read requests in an interleaving manner through the plurality of channels (step S90); and outputting the received data (i.e., read data) to a host or temporarily storing the received data in an internal memory (step S95).

In some embodiments, the operation method of the memory system may further include: sequentially performing address translation on uncorrelated read requests and transferring the uncorrelated read requests to the plurality of memory dies, and receiving data corresponding to the uncorrelated read requests from the plurality of memory dies. For example, the memory system 110 may not execute the read requests according to the order in which the read requests are inputted, but determine the order to execute the read requests, depending on whether the read requests are correlated. The memory system 110 may first execute the correlated read requests, and then execute the uncorrelated read requests.

The determining of whether to perform the correlation operation based on the number of read requests transferred for the correlation operation (step S40) may be performed with reference to the number of read requests transferred for the correlation operation, the operation state of the output buffer 186, and the like. In order to perform the correlation operation within such a range that does not degrade the I/O throughput of the memory system 110, an operation margin for the correlation operation may be secured before the correlation operation is performed.

In some embodiments, the operation method of the memory system may further include determining whether an amount of data (or the number of data units or data pieces), which are to be outputted to the host and remain in the output buffer 186, is greater than a reference value. At this time, the reference value may be determined according to a first data I/O speed between the host and the memory system 110 and a second data I/O speed between the controller 130 and the plurality of memory dies. For example, when it takes 10 ms for the memory system to output one data to the host, if the output buffer 186 stores 10 pieces of data to be outputted to the host, the memory system may have an operation margin of 100 ms (=10×10). For example, when it takes 5 ms to transfer a read request and receive data between the controller 130 and the memory device 150 within the memory system 110, the controller 130 may try correlation for a maximum of 95 ms in the operation margin of 100 ms.

The controller 130 may know the operation speed of an internal operation and the time required for the internal operation, and calculate an operation margin based on a protocol with the host interworking with the memory system 110. Through this operation, the controller 130 may calculate and estimate an operation margin for trying correlation. For example, the controller 130 may calculate the maximum value of the operation margin for correlation, and then perform correlation during a time corresponding to 70 to 90% of the maximum value. In an embodiment, the time range in which the controller 130 can try correlation may be changed. Furthermore, the controller 130 may determine an operation margin during which the controller 130 can try correlation, according to the operation environment of the memory system 110 and the operation state of the memory device 150.

In some embodiments, the plurality of read requests may include an internal read request for an internal read operation and an external read request received from the host 102. For this operation, the controller 130 may determine whether the amount of data which are to be outputted to the host 102 and remain in the output buffer 186 is greater than a set value. The set value may be determined according to the first data I/O speed between the host 102 and the memory system 110 and the second data I/O speed between the controller 130 and the plurality of memory dies.

The internal operation may include an operation which is independently performed by the memory system 110, regardless of a request or inquiry received from the external device such as the host. The internal operation on the memory device 150 may include an operation of copying data stored in a random memory block into another random memory block and processing the copied data (for example, garbage collection), an operation of swapping data stored in memory blocks between the memory blocks (for example, wear leveling), an operation of storing map data stored in the controller 130 into memory blocks (for example, map flush), or a background operation of managing bad blocks of the memory device 150. The internal read operation may include an operation of reading data stored in a memory block on which garbage collection or wear leveling is to be performed. Furthermore, the internal read operation may include an operation of reading map data stored in a random memory block in order to perform a map update operation. The controller 130 may generate an internal read request for the internal read operation, and temporarily store the internal read request in a channel buffer before outputting the internal read request to the memory device 150.

The determining of the idle channel among the plurality of channels (step S50) may include checking the number of read requests stored in the channel buffer. The channel buffer may temporarily store read requests which are to be outputted to the plurality of memory dies through the plurality of channels. When the number of read requests stored in the channel buffer is less than a target value, the controller 130 may determine the corresponding channel as an idle channel. The controller 130 may not perform a correlation operation on an internal read request which is first transferred, among internal read requests related to the idle channel, but output the internal read request to the corresponding memory die through the idle channel (step S55). In step S60, the controller 130 may perform the correlation operation according to the order in which the plurality of read requests are transferred. The controller 130 may output correlated read requests before uncorrelated read requests, thereby improving the I/O throughput of the memory system 110.

In order to avoid degradation in I/O throughput of the memory system 110, the controller 130 may not try a correlation operation on some of the plurality of read requests. For example, when the module for performing address translation is in an idle state, the controller 130 may not try to correlate a first or second read request.

When map data related to logical addresses in the respective read requests are not stored in a region within a cache memory or volatile memory, the operation method may include requesting the corresponding map data from the plurality of memory dies. When the cache memory or the volatile memory does not have enough space to store the map data, the controller 130 may load necessary map data, and program unnecessary map data to the memory device 150. For example, when the requested map data cannot be stored in a region, the controller 130 may remove the least recently used map data from the region. In an embodiment, when the requested map data cannot be stored in a region, the controller 130 may remove the least frequently used map data from the region.

The controller 130 may correlate read requests coupled to different channels. Furthermore, the controller 130 may correlate the plurality of read requests by the number of channels. For example, when the number of channels is 5, the controller 130 may perform a correlation operation on five read requests related to different channels.

In order to avoid degradation in I/O throughput of the memory system 110, the controller 130 may not try to correlate some of the plurality of read requests. At this time, when the number of read requests to be correlated is less than the number of the plurality of memory dies, the controller 130 may output the read requests without a correlation operation. Furthermore, the controller 130 may stop a correlation operation even when the number of read requests which are not yet correlated during the correlation operation is less than the number of the plurality of memory dies. That is, the controller 130 may determine whether to perform or skip the correlation operation on the plurality of read requests, based on the number of read requests transferred for the correlation operation.

In step S80), the controller 130 may perform address translation on the read requests according to the execution sequence changed by the correlation operation. The controller 130 may translate the logical addresses transferred with the correlated read requests into physical locations in which data are stored, using the map data loaded in the map memory 182, and output the corresponding read requests to the memory device 150. At this time, the controller 130 may output the correlated read requests to the memory dies before the uncorrelated read requests.

When the data received from the memory dies are data related to external read requests (step S90), the controller 130 may output the received data to the host 102 in step S95. Thus, the controller 130 may temporarily store the received data in the output buffer 186, and the output buffer 186 may output the data to the host 102 according to the order in which the data are stored (step S95). Furthermore, when the data received from the memory dies in step S90 are data related to internal read requests, the controller 130 may temporarily store the received data in the internal memory 144, and store the stored data in the memory dies again (step S95).

FIG. 9 is a diagram for describing a first operation of the controller 130 on a plurality of read requests. Specifically, the first operation may be performed by the correlation circuitry 194 in FIG. 6.

The operation of FIG. 9 is based on a plurality of read requests RD_REQ1 to RD_REQ10 transferred for the correlation operation that may be stored in the correlation circuitry 194.

In the present embodiment, the read requests may include an external read request EX_RD_REQ and an internal read request IN_RD_REQ. The external read request EX_RD_REQ is received from the host 102 in order to request the memory system 110 to output data stored in a memory die to the host 102. The internal read request IN_RD_REQ is generated by the controller 130 for the internal read operation of the memory system 110.

As illustrated in FIG. 9, the plurality of read requests EX_RD_REQ1 to EX_RD_REQ8, IN_RD_REQ9 and IN_RD_REQ10 stored in the correlation circuitry 194 may be sorted according to the order in which the read requests are transferred. Furthermore, some of map data on logical addresses are loaded in the map memory 182, before 10 read requests EX_RD_REQ1 to EX_RD_REQ8, IN_RD_REQ9 and IN_RD_REQ10 are correlated. When the map data for translating the logical addresses LBA transferred with 10 read requests EX_RD_REQ1 to EX_RD_REQ8, IN_RD_REQ9 and IN_RD_REQ10 are not loaded in the map memory 182, the controller 130 may receive necessary map data from the memory device 150, and store the received map data in the map memory 182. In an embodiment, the map data may include memory die information related to the external read request EX_RD_REQ. In an embodiment, the map data may further include memory die information related to the internal read request IN_RD_REQ.

The read requests RD_REQ1 to RD_REQ10 have the same codes, the same structure and the like according to a predefined protocol. In FIG. 9, however, the read requests are expressed according to the order of 1 to 10, for convenience of description.

The correlation circuitry 194 may check a physical address of the memory device 150, which corresponds to a logical address LBA transferred from the host with the external read request EX_RD_REQ, by referring to the map data stored in the map memory 182. The physical address may include the address of a memory die in the memory device 150 or the address of a channel coupled to the memory die. The correlation circuitry 194 may check a physical address of the memory device 150, corresponding to the internal read request IN_RD_REQ.

When checking memory dies or channels within the memory device 150, corresponding to the read requests RD_REQ1 to RD_REQ10, using the map data, the correlation circuitry 194 may recognize channels through which the respective read requests are to be outputted as described with reference to FIG. 9. However, in order to prevent the operation control circuitry 196 from being in an idle state as described with reference to FIG. 7, the correlation circuitry 194 may not check to which channel a specific number of read requests which are first received (for example, read requests received for the first time) are to be outputted.

FIG. 10 is a diagram for describing a second operation of the controller 130 in response to a plurality of read requests.

In an embodiment, the second operation may be performed by the correlation circuitry 194.

In some embodiments, the correlation circuitry 194 may not try to correlate the first read request EX_RD_REQ1, but output the first read request EX_RD_REQ1 to the operation control circuitry 196. The correlation circuitry 194 may perform a correlation operation on the other read requests from the second read request EX_RD_REQ2 to the last read request IN_RD_REQ10. Based on the logical addresses LBA transferred with the read requests from the second read request EX_RD_REQ2 to the last read request IN_RD_REQ10, the correlation circuitry 194 may check in which memory dies data are stored and through which channels the data are to be outputted. Then, the correlation circuitry 194 may sequentially correlate the read requests.

In FIG. 10, however, the case in which the correlation operation is performed on the read requests from the first read request EX_RD_REQ1 to the last read request IN_RD_REQ10 because the operation control circuitry 196 and the channels CH1 and CH2 are busy, will be taken as an example for description. In the illustrated example of FIG. 10, the first external read request EX_RD_REQ1 and the second external read request EX_RD_REQ2 may be correlated, and the third external read request EX_RD_REQ3 and the fourth internal read request IN_RD_REQ4 may be correlated. Furthermore, the fifth external read request EX_RD_REQ5 and the eighth external read request EX_RD_REQ8 may be correlated, the sixth external read request EX_RD_REQ6 and the ninth external read request EX_RD_REQ9 may be correlated, and the seventh external read request EX_RD_REQ7 and the tenth internal read request IN_RD_REQ10 may be correlated.

Figure 11:
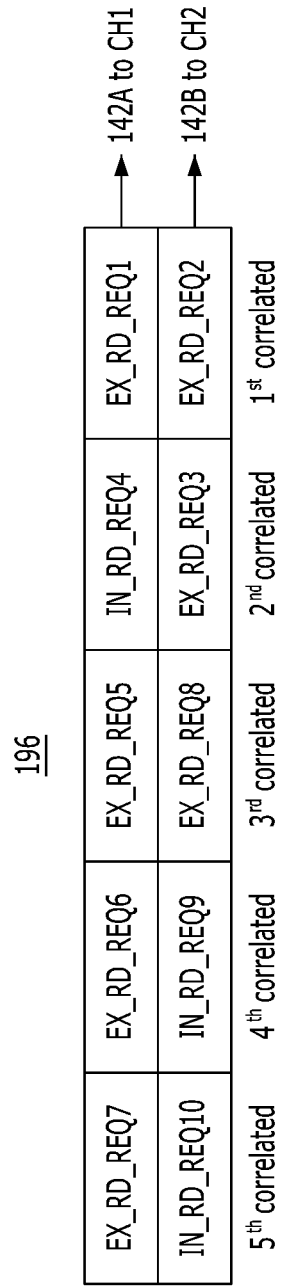
FIG. 11 illustrates an example of a method for outputting correlated read requests to a channel in accordance with the first embodiment.

FIG. 11 shows the result of the correlation operation performed by the controller 130 in FIG. 10. Referring to FIG. 11, the correlated read requests RD_REQ outputted to the operation control circuitry 196 from the correlation circuitry 194 may be sorted according to the order in which the read requests RD_REQ are transferred to the correlation circuitry 194 and the order in which the read requests RD_REQ are to be executed by the operation control circuitry 196. For example, since the eighth external read request EX_RD_REQ8 was received by the correlation circuitry 194 after the sixth external read request EX_RD_REQ6, the eighth external read request EX_RD_REQ8 needs to be executed after the sixth external read request EX_RD_REQ6. However, since the eighth external read request EX_RD_REQ8 is correlated with the fifth external read request EX_RD_REQ5 before the sixth external read request EX_RD_REQ6, the eighth external read request EX_RD_REQ8 may be executed with the fifth external read request EX_RD_REQ5.

Then, the correlation circuitry 194 may output the correlated read requests through different channels at the same time. In the illustrated example of FIG. 11, the first external read request EX_RD_REQ1 correlated with the second external read request EX_RD_REQ2 may be outputted to a first channel buffer 142A coupled to the first channel CH1, and the second external read request EX_RD_REQ2 correlated with the first external read request EX_RD_REQ1 may be outputted to a second channel buffer 142B coupled to the second channel CH2. At this time, the first and second external read requests EX_RD_REQ1 and EX_RD_REQ2 correlated with each other may be outputted to the first and second channels CH1 and CH2 at the same time.

Then, the controller 130 may receive data, related to the first and second external read requests EX_RD_REQ1 and EX_RD_REQ2, in an interleaving way from the memory dies DIE2 and DIE3 through the first and second channels CH1 and CH2.

As described above, the controller 130 may correlate the plurality of read requests transferred to the memory system 110 in response to the number of channels in the memory system 110, and then execute the read requests. Although an address limitation structure for interleaving the locations of data stored in the memory system 110 is not used, the controller 130 may correlate a plurality of read requests inputted to the memory system 110, and then execute the read requests according to a set order. Therefore, data may be transmitted and received between the memory device 150 and the controller 130 in an interleaving way.

Although some of the plurality of read requests transferred to the memory system 110 are correlated, the I/O throughput of the memory system 110 can be improved more than when none of the plurality of read requests are interleaved. In order to prevent degradation in I/O throughput of the memory system 110 by a correlation operation, the correlation operation may be performed on the read requests when data to be outputted to the host 102 are stored in the output buffer 186 of FIG. 5. For example, when 30 read requests are received while no data are stored in the output buffer 186, the memory device 150 may control the operation control circuitry 196 to execute three read requests among the 30 read requests without a correlation operation, according to the order in which the read requests are inputted.

When three read requests are left after the correlation operation, during the process of trying to correlate 27 read requests, the correlation circuitry 194 may stop trying to correlate the three read requests which are left after the correlation operation. When the correlation circuitry 194 uses an unnecessary resource to try to correlate a small number of read requests, the I/O throughput of the memory system 110 may be degraded.

As described above, the controller 130 may determine whether to try to correlate the plurality of read requests, according to the operation environment of the memory system 110. For example, the controller 130 may determine whether to try to correlate some read requests of the plurality of read requests, which are inputted before the other read requests, according to the state of the output buffer 186. Furthermore, when read requests to be correlated are continuously transferred, the controller 130 may continuously try to correlate the read requests. However, when no more read requests are transferred from the host, the controller 130 may process read requests which are not correlated but remain, according to the order in which the read requests are inputted, than try to correlate the read requests, thereby preventing degradation in I/O performance of the memory system 110.

The memory system 110 cannot previously determine the possibility that the plurality of read requests will be correlated. For example, the correlation probability of the correlation operation of the controller 130 may rise with the increase in the number of input read requests, but fall with the decrease in the number of input read requests. Since data can be distributed and stored in the memory device 150 without address limitation, the probability that the controller 130 can correlate the plurality of received read requests may be changed from time to time. The correlation operation of the controller 130 may be applied to both of a random read operation and a sequential read operation which are requested for the memory system 110.

Figure 12:
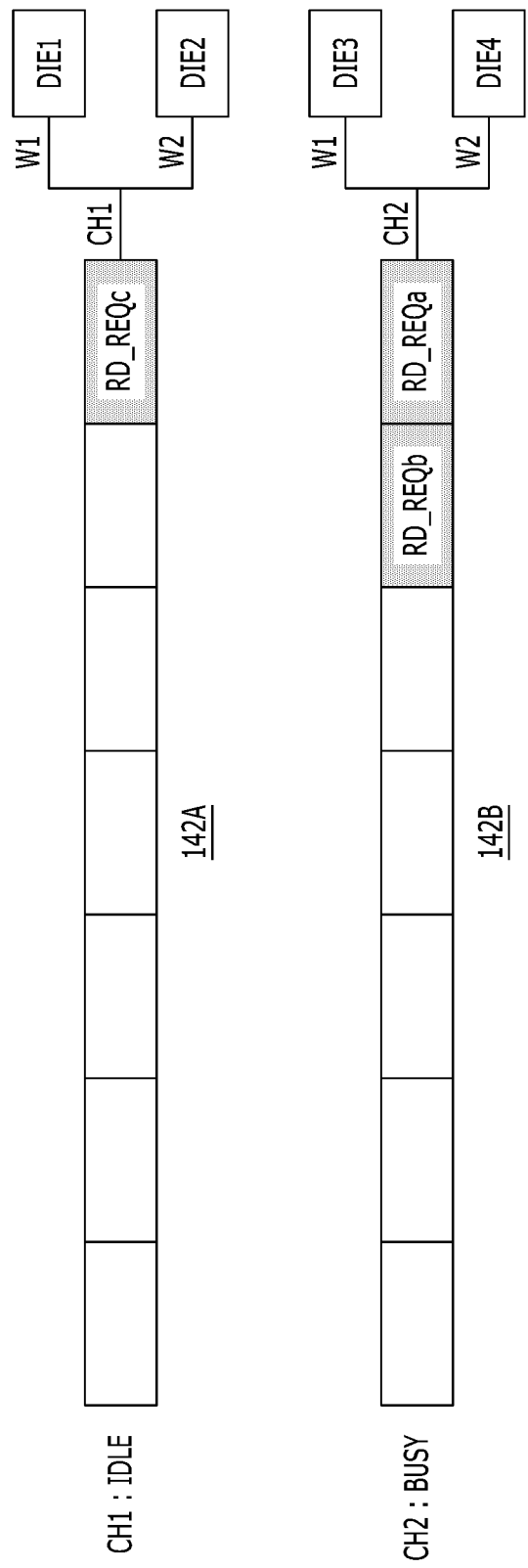
FIG. 12 illustrates an example of channel buffers of the memory system.

FIG. 12 illustrates examples of first and second channel buffers 142A and 142B in the operation control circuitry 196 illustrated in FIG. 6. Referring to FIG. 12, the first and second channel buffers 142A and 142B may store a plurality of read requests RD_REQa, RD_REQb and RD_REQc which are to be outputted to the first to fourth memory dies DIE1 to DIE4.

The read requests stored in the first channel buffer 142A may be outputted to the first or second memory die DIE1 or DIE2 through the first channel CH1. For example, the first channel buffer 142A may store the read request RD_REQc, and the stored read request RD_REQc may be outputted to the first channel CH1. Thus, the first channel CH1 may be set in a busy state BUSY or maintained in the busy state BUSY. The read requests stored in the second channel buffer 142B may be outputted to the third or fourth memory die DIE3 or DIE4 through the second channel CH2. For example, the second channel buffer 142B may store the read requests RD_REQa and RD_REQb, and the stored read requests RD_REQa and RD_REQb may be outputted to the second channel CH2. Thus, the second channel CH2 may be set in the busy state BUSY or maintained in the busy state BUSY.

However, the first channel buffer 142A may store only one read request RD_REQc to be outputted to the first channel CH1. After one read request RD_REQc is outputted to the first channel CH1, the first channel CH1 may be set in an idle state IDLE. The idle state IDLE of the channel may serve as a factor to degrade data I/O throughput.

Figure 13:
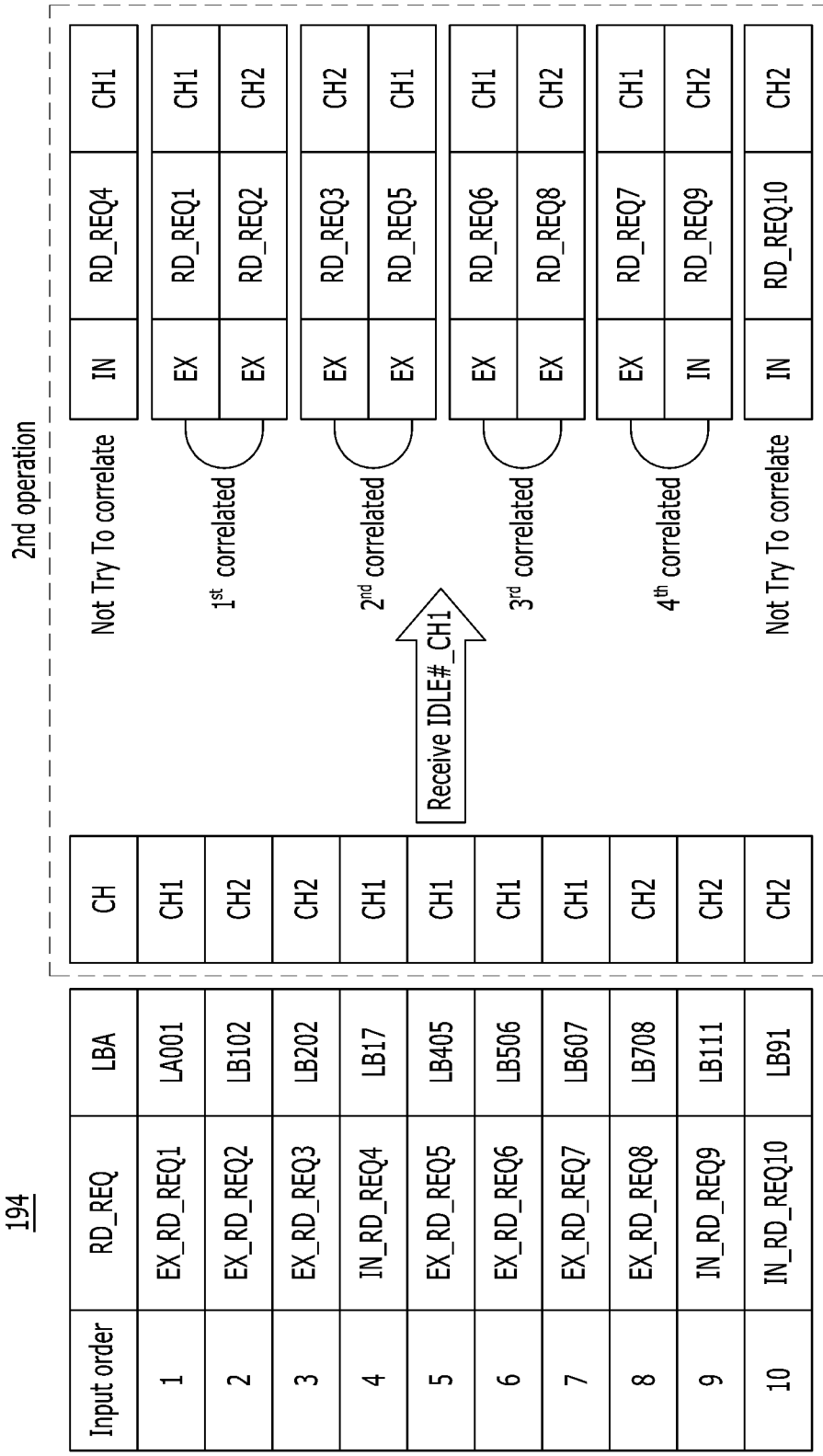
FIG. 13 illustrates a second operation of the controller in accordance with a second embodiment of the present invention.
Figure 14:
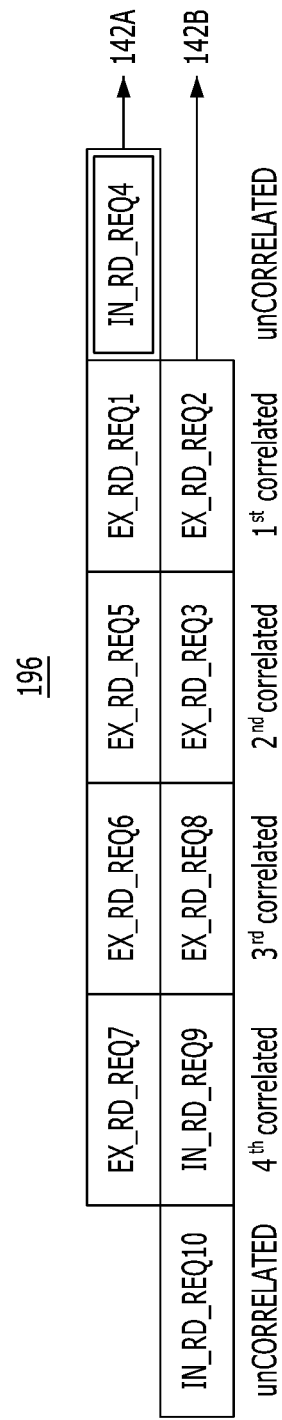
FIG. 14 illustrates an example of a method for outputting correlated read requests to channel buffers in accordance with the second embodiment.
Figure 15:
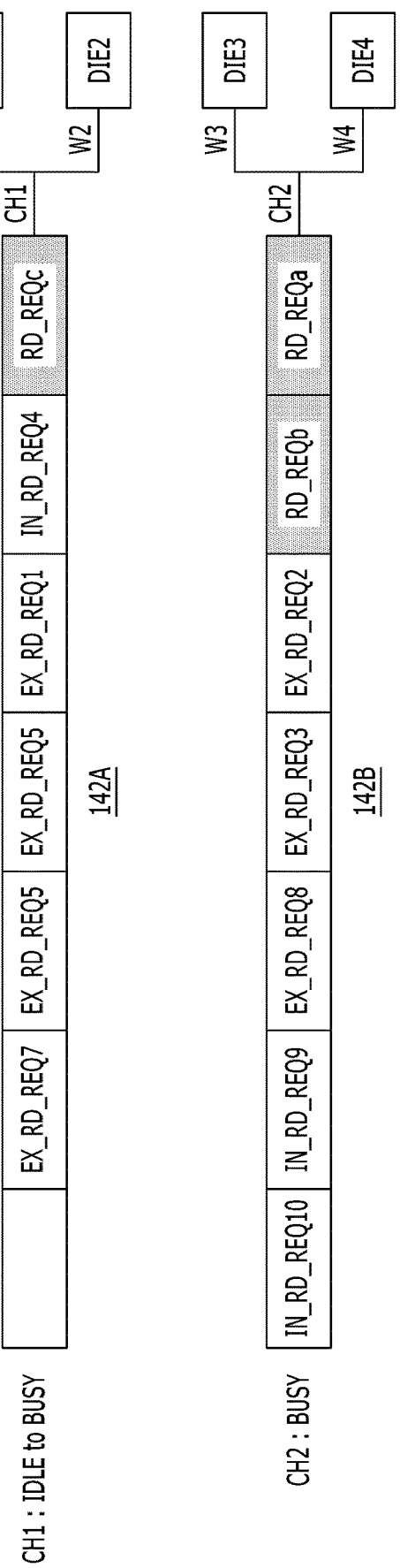
FIG. 15 illustrates an example of a method for outputting correlated read requests to an idle channel in accordance with the second embodiment.

A memory system 110 in accordance with a second embodiment can improve data I/O throughput through a data I/O control method illustrated in FIGS. 13 to 15. Hereafter, an operation method of the memory system 110 in accordance with the second embodiment is described. The descriptions of FIGS. 13 to 15 are focused on components which are technically distinguished from FIGS. 9 to 11. FIGS. 13 to 15 may include all of the technical contents described with reference to FIGS. 9 to 12.

When entering the correlation mode, the correlation circuitry 194 may check whether idle information IDLE # generated by the controller 130 is received, before performing a correlation operation (i.e., second operation) on a plurality of read requests RD_REQ stored in the correlation circuitry 194. That is, the controller 130 may determine whether to generate the idle information IDLE #, based on the number of read requests RD_REQ stored in the first and second channel buffers 142A and 142B, before performing the correlation operation.

The idle information IDLE # may include identification information on an idle channel. The controller 130 may recognize, as an idle channel, a channel coupled to a channel buffer which stores read requests less than a set target value. For example, when the target value is set to '2', the controller 130 may recognize, as an idle channel, the first channel CH1 coupled to the first channel buffer 142A in which the read request RD_REQc less than two is stored (refer to FIG. 12).

In the illustrated example of FIG. 13, the correlation circuitry 194 may search an internal read request IN_RD_REQ which is related to the first channel CH1 and has been first inputted to the correlation circuitry 194, according to the idle information IDLE #_CH1 indicating that the first channel CH1 is idle or will be idle soon. Thus, the fourth internal read request IN_RD_REQ4 may be searched.

The correlation circuitry 194 may not try to correlate the searched fourth internal read request IN_RD_REQ4, but output the searched fourth internal read request IN_R-

D_REQ4 to the operation control circuitry 196, such that the searched fourth internal read request IN_RD_REQ4 can be rapidly outputted to the first channel CH1.

The correlation circuitry 194 may exclude the fourth internal read request IN_RD_REQ4, which has been already outputted to the operation control circuitry 196, from the targets on which the correlation operation is to be performed. The correlation circuitry 194 may correlate the other 9 read requests RD_REQ, stored in the correlation circuitry 194, based on the input order. The correlation circuitry 194 may output the correlated read requests to the operation control circuitry 196.

After the first to ninth read requests are outputted to the operation control circuitry 196, only the tenth read request IN_RD_REQ10 may be left in the correlation circuitry 194, and another read request RD_REQ to be correlated with the tenth internal read request IN_RD_REQ10 may not be inputted to the correlation circuitry 194. In this case, the correlation circuitry 194 may exit from the correlation mode, and output the tenth internal read request IN_RD_REQ10, stored in the correlation circuitry 194, to the operation control circuitry 196, without trying to correlate the tenth internal read request IN_RD_REQ10.

When the read requests correlated by the correlation operation and the uncorrelated read requests occur, the correlation circuitry 194 may output the correlated read requests to the operation control circuitry 196 before the uncorrelated read requests.

Although not illustrated, idle information IDLE #_CH2 on the second channel CH2 may be inputted after the first external read request EX_RD_REQ1 and the second external read request EX_RD_REQ2 are correlated and outputted to the operation control circuitry 196. In this case, the correlation circuitry 194 may search the ninth internal read request IN_RD_REQ9 which is related to the second channel CH2 and has been earliest inputted. The correlation circuitry 194 may not try to correlate the searched ninth internal read request IN_RD_REQ9, but output the searched ninth internal read request IN_RD_REQ9 to the operation control circuitry 196, such that the searched ninth internal read request IN_RD_REQ9 can be rapidly outputted to the second channel CH2 in an idle state.

The correlation circuitry 194 may try to correlate seven read requests RD_REQ other than the first and second external read requests EX_RD_REQ1 and EX_RD_REQ2 which have been already correlated and outputted to the operation control circuitry 196 and the ninth internal read request IN_RD_REQ9 which is not correlated but outputted to the operation control circuitry 196. In this case, the performance result of the correlation operation may be different from that illustrated in FIG. 13.

FIG. 14 is a diagram for describing a read request operation of the controller 130 on a plurality of read requests. FIG. 14 illustrates that the plurality of read requests RD_REQ outputted to the operation control circuitry 196 from the correlation circuitry 194 are sorted according to the execution sequence of the operation control circuitry 196. Referring to the execution sequence of the sorted read requests RD_REQ, the correlation circuitry 194 may first output the fourth internal read request IN_R-D_REQ4 to the operation control circuitry 196, even though the fourth internal read request IN_RD_REQ4 is inputted to the correlation circuitry 194 for the fourth time.

Thus, as illustrated in FIG. 15, the operation control circuitry 196 may store the fourth internal read request IN_RD_REQ4 in the first channel buffer 142A for the first time, and output the fourth internal read request IN_R-D_REQ4 to the first channel CH1 for the first time. Thus, the first channel CH1 may be switched from an idle state IDLE to a busy state BUSY or continuously maintain a busy state. That is, the memory system 110 may prevent idle states of the channels, and thus improve the data I/O throughput.

When the correlated first and second external read requests EX_RD_REQ1 and EX_RD_REQ2 are received from the correlation circuitry 194, the operation control circuitry 196 stores the first and second external read requests EX_RD_REQ1 and EX_RD_REQ2 in the first and second channel buffers 142A and 142B, respectively. After the read requests RD_REQa, RD_REQb and RD_REQc and the fourth internal read request IN_RD_REQ4, which have been already stored in the operation control circuitry 196, are outputted to the first and second channels CH1 and CH2, the operation control circuitry 196 may output the correlated first and second external read requests EX_RD_REQ1 and EX_RD_REQ2 to the first and second channels CH1 and CH2 substantially at the same time. For example, the operation control circuitry 196 may output the first and second external read requests EX_RD_REQ1 and EX_R-D_REQ2 to the first and second channels CH1 and CH2 in response to the same clock.

The controller 130 may receive data corresponding to the correlated first and second external read requests EX_R-D_REQ1 and EX_RD_REQ2 in an interleaving way through the first and second channels CH1 and CH2. The controller 130 may output the data, received in an interleaving way through the first and second channels CH1 and CH2, to the host. At this time, the controller 130 may temporarily store the received data in the output buffer 186, and the output buffer 186 may output the data to the host according to the order in which the data are stored.

Although various embodiments have been described for illustrative purposes, it will be apparent to those skilled in the art that various changes and modifications may be made without departing from the spirit and scope of the invention as defined in the following claims.

What is claimed is:

1. A memory system comprising:
    a plurality of memory dies configured to store data therein; and
    a controller coupled with the plurality of memory dies via a plurality of channels and configured to perform a correlation operation of a plurality of combined read requests so that the plurality of memory dies output plural pieces of data corresponding to the plurality of combined read requests via the plurality of channels in an interleaving way,
    wherein the controller is configured to determine whether to perform the correlation operation based on a number of the plurality of combined read requests, and
    wherein the plurality of combined read requests include a first read request only for an internal operation of the controller and a second read request received from a host,
    wherein the internal operation includes a read operation for moving data stored in at least one of the memory die, into at least another memory die.

2. The memory system of claim 1, wherein the controller determines an idle channel among the plurality of channels and performs the correlation operation of remaining read requests except for the first read request, which is related to the idle channel.

3. The memory system of claim 2, wherein the controller transfers the first read request, which is related to the idle channel and on which the correlation operation is not performed, to the plurality of memory dies through the idle channel.

4. The memory system of claim 3, wherein the controller determines a transferring order of the first read request for the internal operation related to the idle channel, based on a receiving order of the read requests for the correlation operation.

5. The memory system of claim 4, wherein the controller sets a transferring priority of the read request having the earliest receiving order as the highest priority.

6. The memory system of claim 1, further comprising: a plurality of channel buffers configured to temporarily store the plurality of combined read requests to be transferred to the plurality of channels, and corresponding to the respective channels,
wherein the controller determines a channel as an idle channel corresponding to a channel buffer which stores the plurality of combined read requests less than a set value, among the plurality of channel buffers.

7. The memory system of claim 6, wherein the data corresponding to the plurality of combined read requests is outputted to the plurality of channels from the plurality of memory dies in response to the plurality of combined read requests.

8. The memory system of claim 7, wherein the controller outputs data, corresponding to the second read request received from the host, to the host among the data corresponding to the plurality of combined read requests.

9. The memory system of claim 8, further comprising: an output buffer configured to temporarily store data to be outputted to the host,
wherein the controller is configured to perform the correlation operation when the number of pieces of data stored in the output buffer, to be outputted to the host, is greater than a set value.

10. The memory system of claim 9, wherein the output buffer includes a queue capable of outputting stored data according to an input sequence of the stored data, and
the controller determines the set value, based on a first data input/output speed between the host and the memory system, and a second data input/output speed between the controller and the plurality of memory dies.

11. The memory system of claim 1, wherein the controller is configured to perform the correlation operation when the number of the plurality of combined read requests transferred for the correlation operation is greater than the number of the plurality of channels.

12. The memory system of claim 1, wherein the controller is configured to stop the correlation operation of remaining read requests not yet correlated when the number of remaining read requests is less than the number of the plurality of memory dies.

13. The memory system of claim 12, wherein the controller determines whether to perform or skip a correlation operation of the plurality of combined read requests, based on the number of the plurality of combined read requests transferred for the correlation operation, and transfers a correlated read request earlier than an uncorrelated read request.

14. The memory system of claim 1, wherein the controller performs the correlation operation to correlate the plurality of combined read requests by the number of the plurality of channels.

15. An operation method of a memory system, comprising:
determining whether to perform a correlation operation based on a number of a plurality of combined read requests;
performing the correlation operation of the plurality of combined read requests to generate correlated read requests, based on the determination result;
transferring the correlated read requests to a plurality of channels coupled to a plurality of memory dies; and
receiving data corresponding to the correlated read requests from the plurality of memory dies via the plurality of channels in an interleaving way,
wherein the plurality of combined read requests include a first read request only for an internal operation of the memory system and a second read request received from a host,
wherein the internal operation includes a read operation for moving data stored in at least one of the memory die, into at least another memory die.

16. The operation method of claim 15, wherein the performing of the correlation operation of the plurality of combined read requests comprises:
determining an idle channel among the plurality of channels; and
performing the correlation operation of remaining read requests except for the first read request, which is related to the idle channel.

17. The operation method of claim 16, further comprising:
transferring the first read request, which is related to the idle channel and on which the correlation operation is not performed, to the plurality of memory dies through the idle channel.

18. The operation method of claim 17, wherein the transferring of the first read request comprises:
determining a transferring order of the first read request related to the idle channel, based on a receiving order of the read requests for the correlation operation.

19. The operation method of claim 18, wherein the determining of the transferring order comprises:
setting a transferring priority of the read request having the earliest receiving order as the highest priority.

20. The operation method of claim 16, wherein the determining of the idle channel comprises:
temporarily storing read requests to be transferred to the plurality of channels, and checking the numbers of read requests stored in a plurality of channel buffers corresponding to the plurality of channels, respectively; and
determining a channel as an idle channel corresponding to a channel buffer which stores the plurality of combined read requests less than a set value, among the plurality of channel buffers.

21. The operation method of claim 15, further comprising:
outputting data, corresponding to the second read request received from the host, to the host among the data corresponding to the plurality of combined read requests.

22. The operation method of claim 15, wherein the determining whether to perform a correlation operation comprises:
performing the correlation operation when the number of pieces of data stored in an output buffer, to be outputted to the host, is greater than a set value,
wherein the set value is determined based on a first data input/output speed between the host and the memory system, and a second data input/output speed between the controller and the plurality of memory dies.

23. The operation method of claim 15, wherein the determining whether to perform a correlation operation comprises:
  stopping the correlation operation of remaining read requests not yet correlated when the number of remaining read requests is less than the number of the plurality of memory dies.

24. The operation method of claim 23, wherein the performing of the correlation operation comprises:
  determining whether to perform or skip a correlation operation of the plurality of combined read requests, based on the number of the plurality of combined read requests transferred for the correlation operation.

25. The operation method of claim 24, wherein the performing of the correlation operation comprises:
  transferring a correlated read request earlier than an uncorrelated read request.

26. The operation method of claim 15, wherein the performing of the correlation operation comprises:
  performing the correlation operation to correlate the plurality of combined read requests by the number of the plurality of channels.

27. A memory system comprising:
a plurality of memory dies;
a controller; and
a plurality of channels coupled between the controller and the plurality of memory dies,
wherein the controller is configured to:
determine an idle channel among the plurality of channels;
transfer at least one first internal read request, which is related to the idle channel through the idle channel;
perform a correlation operation of a plurality of combined read requests, which include a second internal read request and a read request received from a host, to generate correlated read requests, wherein the second internal read request does not include the first internal read request; and
transfer the correlated read request to multiple memory dies among the plurality of memory dies, through at least one remaining channel among the plurality of channels,
wherein the first and second internal read request are only for an internal operation, which includes a read operation for moving data stored in at least one of the memory die, into at least another memory die.

* * * * *